(12) United States Patent
Zhou et al.

(10) Patent No.: US 8,785,004 B2
(45) Date of Patent: Jul. 22, 2014

(54) UV LIGHT-EMISSIVE FLUORENE-BASED COPOLYMERS

(75) Inventors: Zhang-Lin Zhou, Palo Alto, CA (US); Chung Ching Yang, Saratoga, CA (US); Lihua Zhao, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 401 days.

(21) Appl. No.: 13/146,398

(22) PCT Filed: Jan. 30, 2009

(86) PCT No.: PCT/US2009/032507
§ 371 (c)(1),
(2), (4) Date: Jul. 26, 2011

(87) PCT Pub. No.: WO2010/087840
PCT Pub. Date: Aug. 5, 2010

(65) Prior Publication Data
US 2011/0278560 A1    Nov. 17, 2011

(51) Int. Cl.
*H01L 51/54* (2006.01)
*C09K 11/06* (2006.01)
*C08G 73/00* (2006.01)
*C08G 63/66* (2006.01)
*C08G 73/06* (2006.01)
*C08G 79/00* (2006.01)
*C08G 77/60* (2006.01)
*C08G 69/40* (2006.01)
*C08G 75/12* (2006.01)
*C08G 61/12* (2006.01)
*H01L 51/00* (2006.01)
*C08G 61/02* (2006.01)

(52) U.S. Cl.
CPC .... *H01L 51/0043* (2013.01); *C08G 2261/3142* (2013.01); *C08G 2261/3162* (2013.01); *C08G 61/12* (2013.01); *C08G 2261/314* (2013.01); *C08G 2261/5222* (2013.01); *C08G 2261/316* (2013.01); *H01L 51/0039* (2013.01); *C08G 61/02* (2013.01); *Y10S 428/917* (2013.01)
USPC ...... 428/690; 428/917; 257/40; 257/E51.036; 528/7; 528/8

(58) Field of Classification Search
None
See application file for complete search history.

(56) References Cited

U.S. PATENT DOCUMENTS

| | | | |
|---|---|---|---|
| 5,807,974 A | 9/1998 | Kim | |
| 5,876,864 A | 3/1999 | Kim | |
| 5,998,045 A | 12/1999 | Chen | |
| 6,312,839 B1 | 11/2001 | Kim | |
| 6,353,083 B1 | 3/2002 | Inbasekaran | |
| 6,800,381 B2 * | 10/2004 | Cho et al. | 428/690 |
| 6,815,505 B2 | 11/2004 | Wu | |
| 6,830,830 B2 | 12/2004 | Hsieh | |
| 6,887,972 B2 | 5/2005 | Huang et al. | |
| 7,057,009 B2 | 6/2006 | Chen | |
| 7,172,811 B2 | 2/2007 | Denisyuk | |
| 7,217,824 B2 | 5/2007 | Zhang | |
| 2001/0012572 A1 | 8/2001 | Araki | |
| 2002/0123550 A1 | 9/2002 | Border et al. | |
| 2003/0039838 A1 | 2/2003 | Chen | |
| 2003/0045642 A1 | 3/2003 | Wu | |
| 2003/0091859 A1 * | 5/2003 | Cho et al. | 428/690 |
| 2003/0099838 A1 | 5/2003 | Cho et al. | |
| 2003/0154647 A1 | 8/2003 | Nguyen | |
| 2003/0207152 A1 | 11/2003 | Hsieh | |
| 2003/0227001 A1 | 12/2003 | Li | |
| 2004/0013904 A1 * | 1/2004 | Cina | 428/690 |
| 2004/0079924 A1 | 4/2004 | Kwag | |
| 2004/0166366 A1 | 8/2004 | Cho | |
| 2004/0229925 A1 | 11/2004 | Zhang | |
| 2005/0070654 A1 | 3/2005 | Hsu | |
| 2005/0079382 A1 * | 4/2005 | Sunaga | 428/690 |
| 2005/0186106 A1 | 8/2005 | Li | |
| 2005/0189873 A1 | 9/2005 | Kelly | |
| 2005/0221124 A1 | 10/2005 | Hwang | |
| 2005/0236977 A1 | 10/2005 | Yamada | |
| 2006/0094859 A1 | 5/2006 | Marrocco et al. | |
| 2006/0159956 A1 | 7/2006 | Ito | |
| 2007/0034832 A1 * | 2/2007 | O'Dell et al. | 252/301.35 |
| 2007/0111029 A1 | 5/2007 | Yamada | |
| 2007/0154736 A1 | 7/2007 | Cina | |
| 2007/0232841 A1 | 10/2007 | Igawa | |
| 2007/0254996 A1 | 11/2007 | Nauka | |
| 2008/0152946 A1 | 6/2008 | Yen | |
| 2008/0200736 A1 | 8/2008 | Kosuge | |
| 2008/0220289 A1 | 9/2008 | Shioya | |
| 2008/0249282 A1 | 10/2008 | Carter | |

FOREIGN PATENT DOCUMENTS

| | | |
|---|---|---|
| EP | 1553119 A1 | 7/2005 |
| EP | 2272894 A1 | 1/2011 |
| JP | 2008218983 | 9/2008 |
| KR | 1020060016413 | 2/2006 |

(Continued)

OTHER PUBLICATIONS

International Search Report (ISR) and Written Opinion of the International Searching Authority (ISA) mailed Oct. 1, 2009 from ISA/KR for counterpart PCT Application No. PCT/US2009/032507 (6 pages).

(Continued)

*Primary Examiner* — Andrew K Bohaty

(57) ABSTRACT

A fluorene-based copolymer of formula I includes a monomeric unit that includes a fluorene group and at least one steric hindering chemical group to provide sufficient steric interaction such that the spatial conformation of the fluorene-based copolymer is substantially non-planar. The fluorene-based copolymer exhibits UV light emission.

13 Claims, 2 Drawing Sheets

(56) References Cited

FOREIGN PATENT DOCUMENTS

| WO | 2005049548 A1 | 6/2005 |
|----|---------------|--------|
| WO | 2005085339 A1 | 9/2005 |
| WO | 2005104213 A2 | 11/2005 |

OTHER PUBLICATIONS

Saleh et al., "Adsorbed Triblock Copolymers Deliver Reactive Iron Nanoparticles to the Oil/Water Interface," Nano Letters, vol. 5, No. 12, 2005, pp. 2489-2494.

Harris et al., "Magnetitie Nanoparticle Dispersions Stabilized with Triblock Copolymers," Chem. Matters, vol. 15, 2003, pp. 1367-1377.

Mu et al., "Well-defined Dendritic-Graft Copolymer Grafted Silica Nanoparticle by Consecutive Surface-Initiated Atom Transfer Radical Polymerizations," Ind. Eng. Chem. Res., vol. 46, 2007, 3069-3072.

Supplymental Search Report; mailed Sep. 5, 2012; issued in related EP case—09839413.3 publiscatin No. 12384346.

Zhou, Xing-Hua, et al. "Highly efficient UV-violet light-emitting polymers derived from fluorene and tetraphenylsilane derivatives: molecular design toward enhanced electroluminescent performance." Macromolecules 40.9 (2007): 3015-3020.

English translation (machine-generated) of Abstract from Japanese Patent Publication No. JP-2008218983.

English translation (machine-generated) of Abstract from Korean Patent Publication No. KR-20060016413.

* cited by examiner

UV LIGHT-EMISSIVE FLUORENE-BASED COPOLYMERS

CROSS-REFERENCE TO RELATED APPLICATIONS

N/A

STATEMENT REGARDING FEDERALLY SPONSORED RESEARCH OR DEVELOPMENT

N/A

BACKGROUND

1. Technical Field

This invention relates to fluorene-based copolymers and their preparation and use as light emitting polymers.

2. Description of Related Art

Organic small molecule light emitting diodes (OLED's) and polymer light-emitting diodes (PLED's) have recently made significant progress toward applications in full color flat panel displays. Advances in the molecular design and synthetic methodology have made tremendous contributions. In an inorganic and organic hybrid LED, the organic material supplies the emissive energy that is transferred to the inorganic semiconducting nanocrystal material for light emission. Fluorene based polymers have recently emerged as attractive light-emitting materials. However, these fluorene based polymers lack sufficient stability, which affects their emission properties.

SUMMARY

An embodiment of the present invention is a fluorene-based copolymer of the formula:

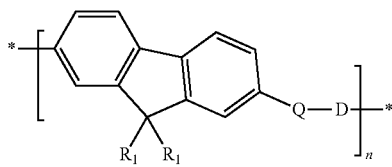

I wherein:

$R_1$ are each independently a steric hindering group,

Q is a bond or one or more unfused or fused aromatic rings,

D is a group comprising an atom that is one of divalent, trivalent and tetravalent, wherein one valency of the atom is filled by an aromatic moiety attached to Q, and wherein the aromatic moiety has a steric hindering group attached thereto, and wherein remaining valencies of the atom are filled with aromatic substituents, and n is an integer selected between 2 and 10,000, wherein the steric hindering groups of $R_1$ and D provide sufficient steric interaction such that the spatial conformation of formula I is substantially non-planar, and wherein the copolymer exhibits UV light emission.

Another embodiment of the present invention is a light-emitting device comprising a first electrode, a second electrode and a polymeric layer disposed between the first electrode and the second electrode. The polymeric layer comprises a fluorene-based copolymer of the formula:

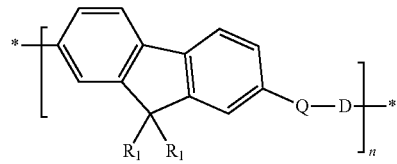

I wherein:

$R_1$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy, $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, Q is a bond or one or more unfused or fused aromatic rings, D is a group comprising an atom that is one of divalent, trivalent and tetravalent, wherein one valency of the atom is filled by an aromatic group attached to Q, and wherein the aromatic group has a steric hindering group attached thereto, and wherein remaining valencies of the atom are filled with aromatic substituents, and n is an integer selected between 2 and 10,000.

Another embodiment of the present invention is a method for forming a fluorene-based copolymer that exhibits enhanced emission properties and stability compared to a fluorene-based polymer that has a substantially planar spatial conformation. The method comprises forming the fluorene-based copolymer from a monomeric unit that comprises a fluorene group and at least one chemical group having a sterically hindered structure. The chemical group renders the spatial conformation of the fluorene-based copolymer non-planar.

BRIEF DESCRIPTION OF THE DRAWINGS

The drawings provided herein are for the purpose of facilitating the understanding of certain embodiments of the present invention and are provided by way of illustration and not limitation on the scope of the appended claims.

DETAILED DESCRIPTION

General Discussion

Figure 1:
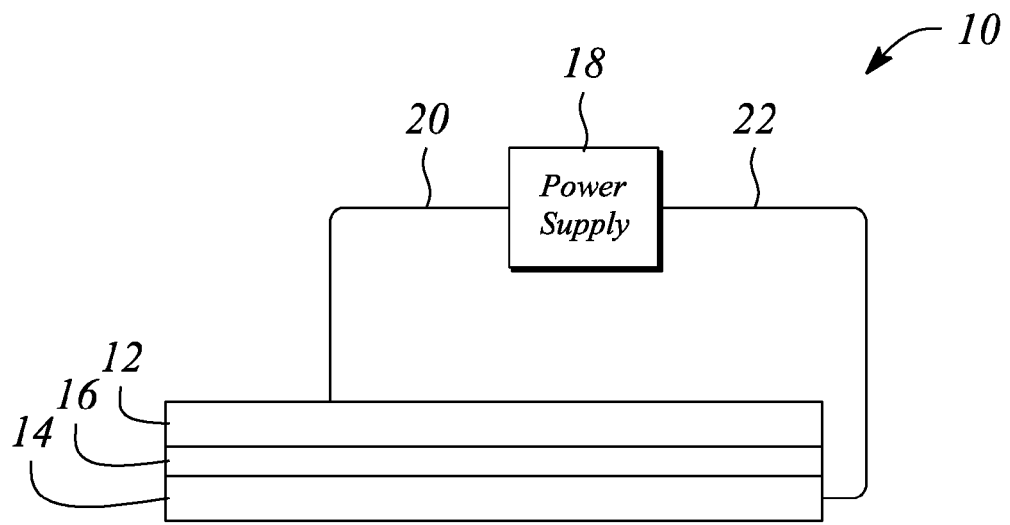
FIG. 1 is a schematic diagram of an embodiment of a light-emitting device employing a fluorene-based copolymer in accordance with the present invention.

Embodiments of the present methods and compositions relate to the design and synthesis of fluorene-based copolymers that exhibit UV emission with enhanced optical properties such as luminescent lifetimes and amplified emissions and with enhanced stability and optical transparency. Known fluorene-based polymers have a spatial conformation that is substantially planar. The performance of known fluorene-based polymers as violet and UV emitters has been hampered by their stability, for example, the tendency to form π-aggregates/excimers, susceptibility to ketone defects and so forth.

The phrase "spatial conformation" relates to the arrangement of the component moieties of the polymers in space. The phrase "substantially planar" means that the atoms of the rings of the fluorene-based polymers are in a plane that passes through the center of each of the atoms of the rings or wherein a plane that passes through the center of each of the atoms of one of the rings varies from a plane that passes through the center of each of the atoms of another of the rings by less than about 10%, or less than about 9%, or less than about 8%, or less than about 7%, or less than about 6%, or less than about 5%, or less than about 4%, or less than about 3%, or less than about 2%, or less than about 1%. The term "π-aggregates/excimers" means the products resulting from the self-aggregation of the polymer chains; more specifically, the term refers to interchain interactions in fluorene-based polymers including excited state interactions (excimers) and/or ground state interactions (aggregates), which will strongly affect absorption and/or emission of such polymers. The term "ketone defects" means photooxidation of the polymer, which refers to the situation where protons of unprotected fluorene rings are oxidized to form ketones, thus radically affecting or destroying the luminescence of the fluorene ring.

The present inventors discovered that the enhanced properties mentioned above (namely, UV emission with enhanced optical properties such as luminescent lifetime and amplified emissions and with enhanced stability), may be realized, and the performance of fluorene-based polymers may be improved, by rendering the spatial conformation of the fluorene-based polymers substantially non-planar. In the present embodiments, the effective conjugation lengths of fluorene-based polymers are controlled by formation of fluorene-based copolymers that comprise a polymer backbone that is interrupted by the introduction of certain structures into the polymer chain. Embodiments of the present methods and compositions relate to methods for enhancing the emission properties and stability of fluorene-based polymers, which have a substantially planar spatial conformation. The present methods comprise forming fluorene-based copolymers from a monomeric unit that comprises a fluorene group and at least one chemical group having a sterically hindered structure, which results from the presence of one or more steric hindering groups. A sterically hindered structure is a structure that results in the ability of the chemical group to render the spatial conformation of the fluorene-based copolymers substantially non-planar.

The phrase "steric hindering group" means a group whose presence in the copolymer chain interferes with the ability of the copolymer chain to be in a substantially planar configuration usually due to the size of the steric hindering group. The steric hindering group is of such a size or of such a structure or both that the interaction of the steric hindering groups renders the fluorene-based copolymer substantially non-planar. The presence of the steric hindering group causes rotation of certain bonds in the copolymer chain in order to accommodate the presence of the steric hindering group. This rotation results in a non-planar configuration because of the twisting of the polymer backbone and the creation of a three-dimensional (3-D) hindered structure. Delocalization of electrons is still present and the copolymer exhibits UV or deep-blue light emission and enhanced stability.

The phrase "substantially non-planar" means that the atoms of the rings of the fluorene-based polymers are not in a plane that passes through the center of each of the atoms of the rings. In such a situation, a plane that passes through the center of each of the atoms of one of the rings varies from a plane that passes through the center of each of the atoms of another of the rings by more than about 10%, or more than about 11%, or more than about 12%, or more than about 13%, or more than about 14%, or more than about 15%, or more than about 16%, or more than about 17%, or more than about 18%, or more than about 19%, or more than about 20%. In some embodiments, the planes of at least two of the rings vary about 10 to about 25%, or about 11 to about 25%, or about 12 to about 25%, or about 13 to about 25%, or about 14 to about 25%, or about 15 to about 25%, or about 10 to about 20%, or about 11 to about 20%, or about 12 to about 20%, or about 13 to about 20%, or about 14 to about 20%, or about 15 to about 20%, or more.

The considerations involved in the introduction of the monomeric units include (a) proper control of extended π-conjugation to achieve pure UV or deep-blue emission; (b) twisted polymer backbones and three-dimensional (3-D) hindered structures for alleviation of self-aggregation of polymer chains to achieve enhanced emission; (c) twisted polymer backbones and 3-D hindered structure to act as the protecting group for the fluorene units to substantially reduce or prevent the polymer from undergoing photo-oxidation or the so-called ketone effect.

The phrase "pure UV or deep-blue emission" means that the polymers have a large energy band gap and emit light in UV regime or with a color of deep blue. The phrase "twisted polymer backbone" means that the polymers are designed in such a way that two connected aromatic rings are not in one plane due to a sterically bulky substitution on at least one of the rings such that the two aromatic rings have planes that vary from each other by about 10 degrees or more, or about 11 degrees or more, or about 12 degrees or more, or about 13 degrees or more, or about 14 degrees or more, or about 15 degrees or more, or about 16 degrees or more, or about 17 degrees or more, or about 18 degrees or more, or about 19 degrees or more, or about 20 degrees or more, and are in that sense "twisted."

In some embodiments, the monomeric units employed to form a fluorene-based copolymer comprise a divalent, trivalent or tetravalent atom. In some embodiments, the structures introduced into the polymer backbone are chemical structures that comprise such an atom where the atom is oxygen, carbon, nitrogen, silicon, and the like and where the atom is in a position that is delta to the point of attachment of the phenyl ring to its neighbor atoms or structures. Such structures may be referred to as comprising δ-oxygen, δ-carbon, δ-nitrogen, δ-silicon, and the like. In some embodiments, the monomeric unit comprises a polynuclear aromatic compound, which may be carbocyclic or heterocyclic.

In some embodiments, the chemical structure incorporated into the fluorene-based copolymer comprises a divalent, trivalent or tetravalent atom wherein the chemical structure is attached to a fluorene group by means of a single covalent bond or one or more unfused or fused aromatic rings. One valency of the divalent, trivalent or tetravalent atom is filled by an aromatic moiety attached to the fluorene moiety or to the unfused or fused aromatic ring group. The aromatic moiety comprises one or more steric hindering groups. The remaining valencies of the atom are filled with aromatic substituents.

In some embodiments, the fluorene-based copolymers have the formula:

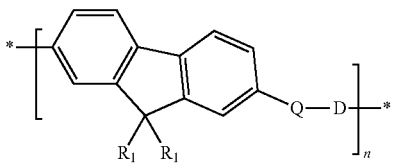

I wherein:
R$_1$ are each independently a steric hindering group,
Q is a bond or one or more unfused or fused aromatic rings, which comprise at least one steric hindering group; in some embodiments, Q is a mononuclear or polynuclear aromatic moiety,
D is a group comprising a divalent, trivalent or tetravalent atom, wherein one valency of the atom is filled by an aromatic moiety attached to Q, and wherein the aromatic moiety has a steric hindering group attached thereto, and wherein the remaining valencies of the atom are filled with aromatic substituents, and
n is an integer selected between 2 and 10,000,
wherein the steric hindering groups of R$_1$, Q and D provide sufficient steric interaction such that the spatial conformation of formula I is substantially non-planar, and wherein the copolymer exhibits UV light emission.

Specific Embodiments of Fluorene-Based Copolymers

In some embodiments, the fluorene-based copolymer comprises repeating monomer units and is of the formula:

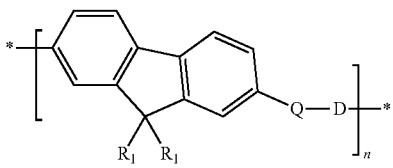

I wherein:
R$_1$ are each independently selected from the group consisting of C$_1$-C$_{30}$ alkyl, C$_2$-C$_{30}$ alkenyl, C$_2$-C$_{30}$ alkynyl, C$_1$-C$_{30}$ aryl, C$_1$-C$_{30}$ alkoxy, C$_2$-C$_{30}$ alkenoxy, C$_2$-C$_{30}$ alkynoxy, C$_1$-C$_{30}$ aryloxy (such as, e.g., phenoxy), C$_1$-C$_{30}$ thioalkyl, C$_2$-C$_{30}$ thioalkenyl, C$_2$-C$_{30}$ thioalkynyl, C$_1$-C$_{30}$ thioaryl, C(O)OR$^4$, N(R$^4$)(R$^5$), C(O)N(R$^4$)(R$^5$), F, Cl, Br, NO$_2$, CN, acyl, carboxylate and hydroxy, wherein R$^4$ and R$^5$ are each independently selected from the group consisting of hydrogen, C$_1$-C$_{30}$ alkyl and C$_1$-C$_{30}$ aryl,
Q is a bond or one or more unfused or fused aromatic rings,
D is a group comprising a divalent, trivalent or tetravalent atom, wherein one valency of the atom is filled by an aromatic moiety attached to Q, and wherein the aromatic moiety has a steric hindering group attached thereto, and wherein the remaining valencies of the atom are filled with aromatic substituents, and
n is an integer selected between 2 and 10,000.

In some embodiments, Q is selected from the group consisting of a single bond or one or more unfused or fused aromatic rings. In some embodiments Q is a mononuclear aromatic moiety, i.e., an aromatic moiety consisting of a single aromatic ring, wherein the atoms of the ring are carbon or wherein one or more atoms of the ring are a heteroatom. In some embodiments, the number of atoms in each ring of the mononuclear aromatic moiety may be 3 or 4 or 5 or 6 or 7 or 8 and may be in the range of 3 to 8, or 4 to 8, or 4 to 7, or 4 to 6, or 5 to 8, or 5 to 7, or 5 to 6, and so forth.

In some embodiments, Q is a single aromatic ring that is composed of carbon atoms or carbon atoms and one or more heteroatoms. Examples of such single aromatic ring moieties, by way of illustration and not limitation, include phenyl, substituted phenyl, pyridine, substituted pyridine, pyrimidine, substituted pyrimidine, and the like.

In some embodiments, Q is a polynuclear aromatic moiety, i.e., an aromatic moiety comprising more than one aromatic ring, wherein the atoms of the rings are carbon or wherein one or more atoms of the ring are a heteroatom. Polynuclear aromatic moieties are aromatic moieties that are polycyclic, i.e., comprise more than one ring, or more than two rings, or more than three rings, or more than four rings, or more than five rings, or more than six rings, and so forth. In some embodiments, at least two rings of the polynuclear aromatic moiety are fused, i.e., the two rings have two atoms and one bond in common and include, for example, spiro fused rings. In some embodiments the rings of the polynuclear aromatic moiety are unfused, i.e., none of the rings of the aromatic moiety have two atoms and one bond in common. When Q is other than a single bond, Q has at least one steric substituent or steric hindering group at a position in an aromatic ring of Q that is ortho to the point of attachment of Q to the fluorene moiety. The steric substituent may be a group selected from those groups that comprise R$_1$.

The aromatic moiety or aromatic substituent is one that comprises an aromatic ring system wherein the electrons of atoms in the ring system are delocalized, e.g., by π-conjugation of electrons of carbon or by π-conjugation of electrons of carbon together with electrons of one or more heteroatoms. In some instances the Hückel rule is satisfied in at least a portion of the rings. The rings of the polynuclear aromatic moiety may include carbocyclic rings and/or heterocyclic rings. The term "carbocyclic ring" denotes a ring in which each ring atom is carbon. The term "heterocyclic ring" denotes a ring in which at least one atom of the ring is not carbon and comprises 1 to 4, or 1 to 3, or 1 to 2, or 2 to 4, or 2 to 3, or 3 to 4, heteroatoms. An aromatic moiety comprising at least two rings, one of which is a heterocyclic ring, may be referred to as a polynuclear aromatic moiety comprising one or more heteroatoms. The number of atoms in each ring of the polynuclear aromatic moiety may be 3 or 4 or 5 or 6 or 7 or 8 and may be in the range of 3 to 8, or 4 to 8, or 4 to 7, or 4 to 6, or 5 to 8, or 5 to 7, or 5 to 6, and so forth.

In some embodiments, the polynuclear aromatic moiety or aromatic substituent may be carbocyclic and comprise fused six-member rings (e.g., benzene rings) including, for example, naphthalene, anthracene, phenanthrene, pyrene, chrysene, benzanthracene, dibenzanthracene, cholanthrene, benzpyrene, coronene, and the like. In some embodiments, the polynuclear aromatic moiety or aromatic substituent may be heterocyclic and comprise one or more fused six-member rings, wherein one or more carbon atoms of one of the rings is replaced by a heteroatom (heterocyclic counterpart of a corresponding carbocyclic compound). Examples of such polynuclear aromatic moiety or aromatic substituent include, for example, heterocyclic counterparts to naphthalene, anthracene, phenanthrene, pyrene, chrysene, benzanthracene, dibenzanthracene, cholanthrene, benzpyrene, coronene, and the like and including, for example, coumarin, quinoline, isoquinoline, benzoquinoline, diazaphenanthrene, pteridine, and the like. In some embodiments, the polynuclear aromatic moiety or aromatic substituent may be heterocyclic and comprise a combination of fused rings, wherein one or more of the rings is a six-member ring and one or more of the rings is a five-member ring, wherein one or more carbon atoms of one of the rings is replaced by a heteroatom (heterocyclic counterpart). Examples of such polynuclear aromatic moiety or aromatic substituent include, for example, carbazole, purine, benzothiophene, benzofuran, indole, and the like.

In some embodiments, D is a group comprising a divalent, trivalent or tetravalent atom. The divalent atoms include, for example, oxygen, sulfur, selenium, tellurium, and the like. The trivalent atoms include, for example, nitrogen, phosphorus, and the like. The tetravalent atoms include, for example, carbon, silicon, germanium and the like.

As mentioned above, one valency of the divalent, trivalent or tetravalent atom is filled by an aromatic moiety attached to Q or to the fluorene moiety if Q is a bond. In some embodiments, the atom is attached to Q at a position that is para to the point of attachment of the atom. In some embodiments, the aromatic moiety has a steric hindering group at a position that is ortho to the point of attachment of the aromatic group to Q and the remaining valencies of the atom are filled with aromatic substituents. An asterisk is provided in the formulas herein to indicate a point in the molecule from which the polymer repeats.

In some embodiments of the present copolymers, D is selected from the group consisting of

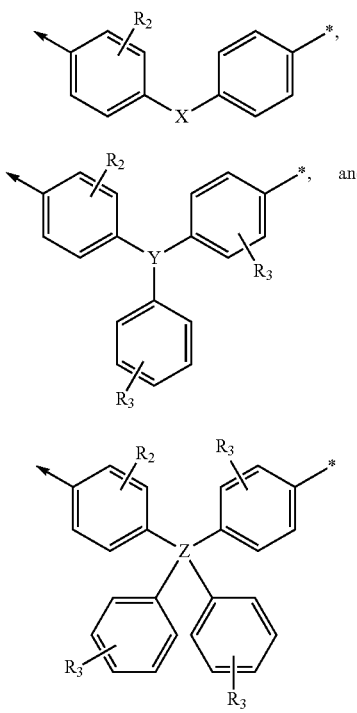

wherein the arrow indicates the point of attachment to Q and the asterisk indicates the point in the molecule from which the polymer repeats, and
wherein:
X is O, S, Te, or Se,
Y is N or P,
Z is C or Si, $R_2$ is selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_3$ are each independently selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000.

In some embodiments of the present copolymers, D is selected from the group consisting of

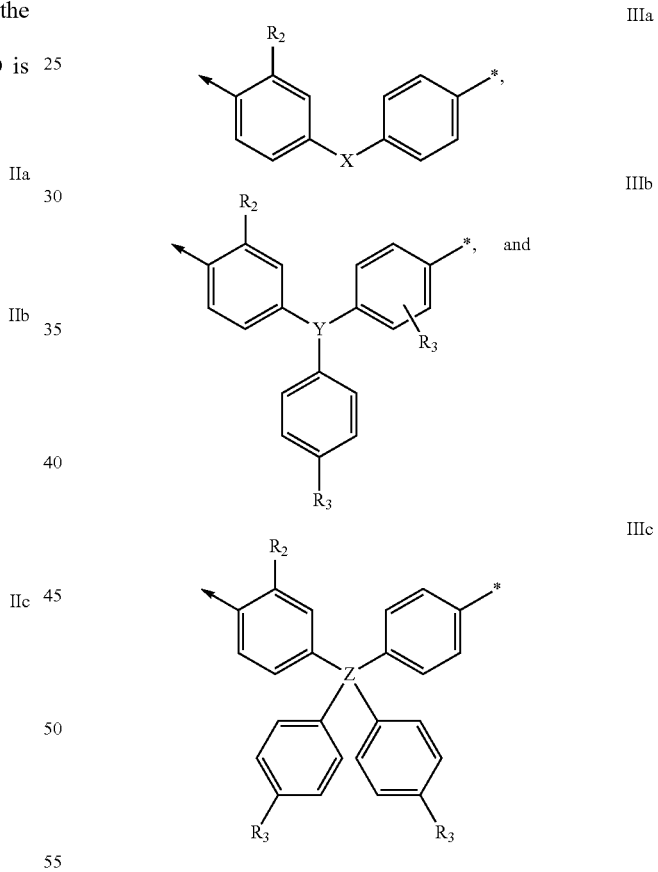

wherein the arrow indicates the point of attachment to Q, and wherein:
X is O, S, Te, or Se,
Y is N or P,
Z is C or Si,
$R_2$ is selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_3$ are each independently selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000.

In some embodiments, the present fluorene-based copolymers have the formula:

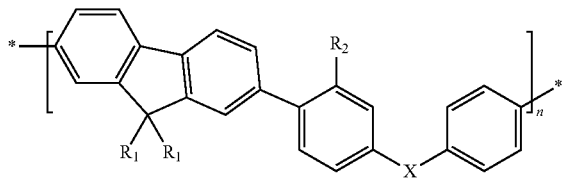

IV wherein

X is O, S, Te, or Se, $R_1$ and $R_2$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000; or having the formula:

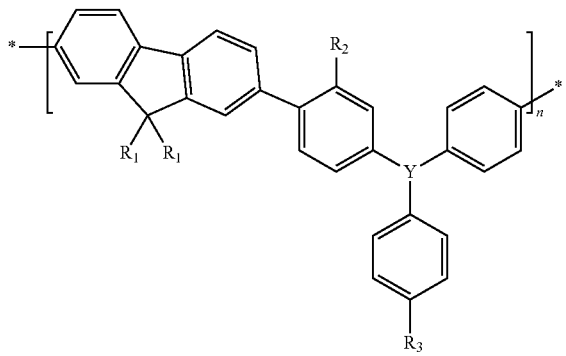

V wherein

Y is N or P, $R_1$ and $R_2$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000; or having the formula:

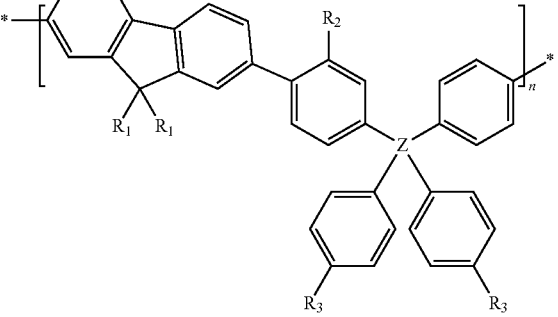

VI wherein

Z is C or $S_1$, $R_1$ and $R_2$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000;

or having the formula:

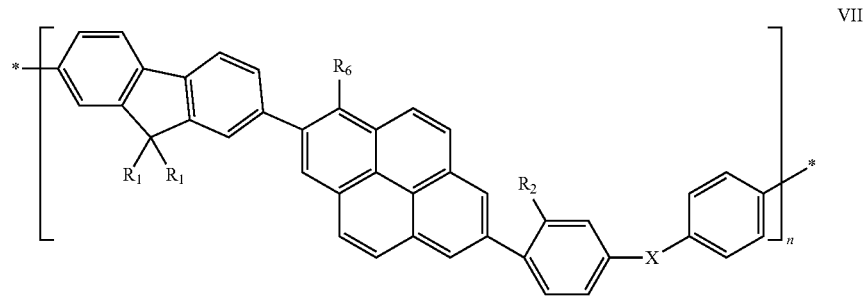

wherein
X is O, S, Te, or Se, $R_1$, $R_2$ and $R_6$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000;
or having the formula:

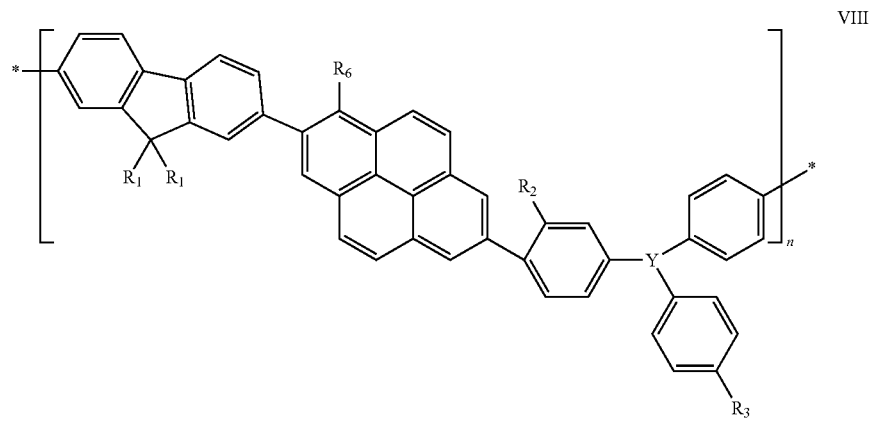

wherein
Y is N or P, $R_1$, $R_2$ and $R_6$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000;

or having the formula:

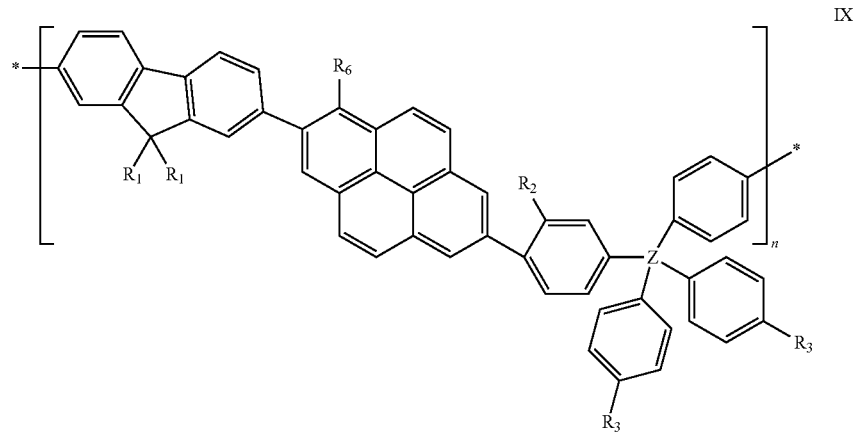

IX wherein

Z is C or $S_1$, $R_1$, $R_2$ and $R_6$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000;

or having the formula:

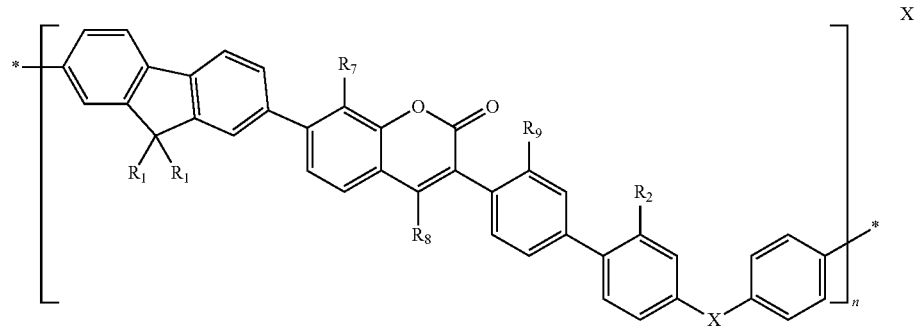

X wherein

X is O, S, Te, or Se, $R_1$, $R_2$, $R_7$, $R_8$ and $R_9$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000;

or having the formula:

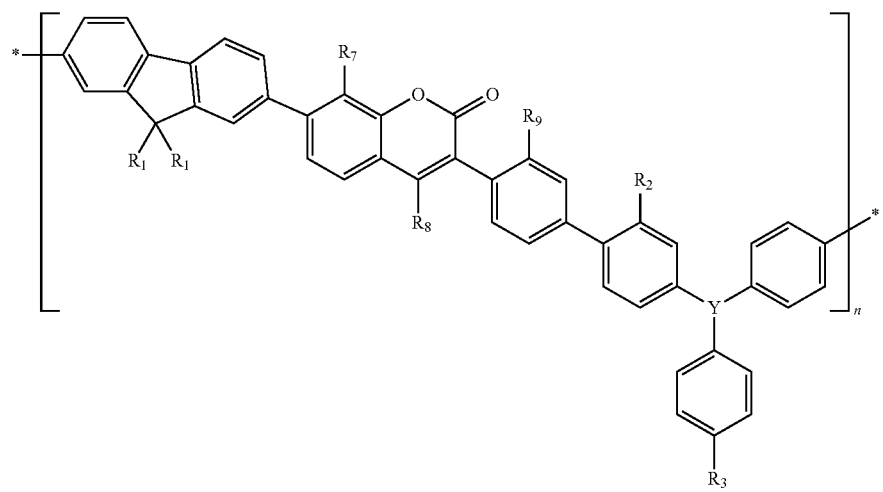

wherein

Y is N or P, $R_1$, $R_2$, $R_7$, $R_8$ and $R_9$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000;

or having the formula:

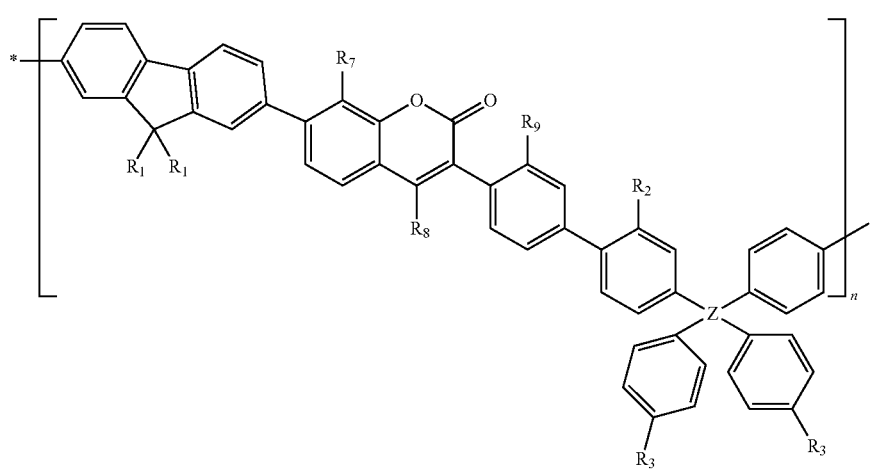

wherein

Z is C or Si, $R_1$, $R_2$, $R_7$, $R_8$ and $R_9$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000;

or having the formula:

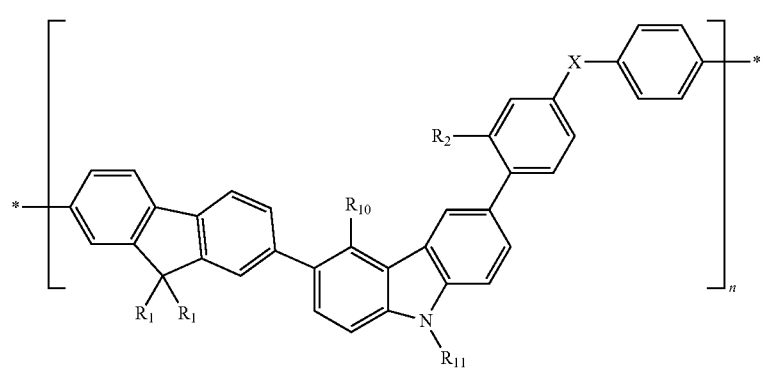

XIII wherein

X is O, S, Te, or Se, $R_1$, $R_2$, $R_{10}$ and $R_{11}$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and n is an integer selected between 2 and 10,000;

or having the formula:

wherein

Y is N or P, $R_1$, $R_2$, $R_{10}$, and $R_{11}$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl,

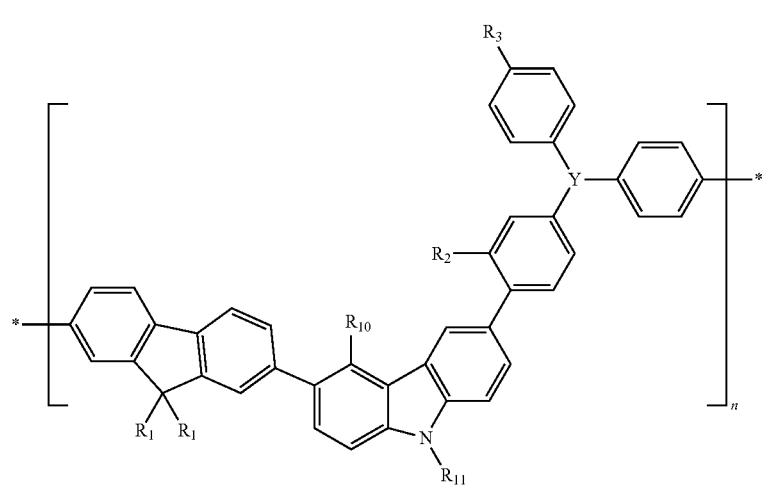

XIV $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, C(O)OR$^4$, N(R$^4$)(R$^5$), C(O)N(R$^4$)(R$^5$), F, Cl, Br, NO$_2$, CN, acyl, carboxylate and hydroxy, wherein R$^4$ and R$^5$ are each independently selected from the group consisting of hydrogen, $C_1$-$C_{30}$ alkyl and $C_1$-$C_{30}$ aryl, and n is an integer selected between 2 and 10,000;
or having the formula:

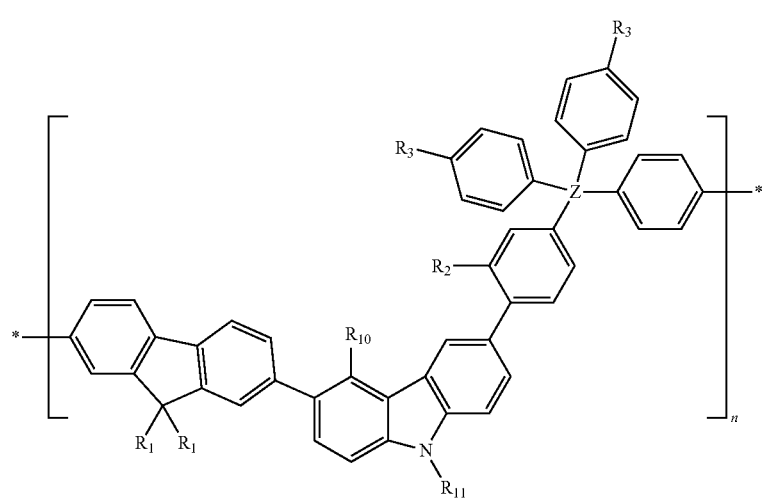

XV wherein

Z is C or S$_1$,

R$_1$, R$_2$, R$_{10}$ and R$_{11}$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, C(O)OR$^4$, N(R$^4$)(R$^5$), C(O)N(R$^4$)(R$^5$), F, Cl, Br, NO$_2$, CN, acyl, carboxylate and hydroxy, wherein R$^4$ and R$^5$ are each independently selected from the group consisting of hydrogen, $C_1$-$C_{30}$ alkyl and $C_1$-$C_{30}$ aryl, R$_3$ is selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, C(O)OR$^4$, N(R$^4$)(R$^5$), C(O)N(R$^4$)(R$^5$), F, Cl, Br, NO$_2$, CN, acyl, carboxylate and hydroxy, wherein R$^4$ and R$^5$ are each independently selected from the group consisting of hydrogen, $C_1$-$C_{30}$ alkyl and $C_1$-$C_{30}$ aryl, and n is an integer selected between 2 and 10,000.

In some embodiments, n in any of the above formulas is an integer between 2 and about 10,000, or between 2 and about 8000, or between 2 and about 6000, or between 2 and about 4000, or between 2 and about 2000, or between 10 and about 10,000, or between 10 and about 8000, or between 10 and about 6000, or between 10 and about 4000, or between 10 and about 2000, or between 50 and about 10,000, or between 50 and about 8000, or between 50 and about 6000, or between 50 and about 4000, or between 50 and about 2000, or between 100 and about 10,000, or between 100 and about 8000, or between 100 and about 6000, or between 100 and about 4000, or between 100 and about 2000, or between 200 and about 10,000, or between 200 and about 8000, or between 200 and about 6000, or between 200 and about 4000, or between 200 and about 2000, or between 500 and about 10,000, or between 500 and about 8000, or between 500 and about 6000, or between 500 and about 4000, or between 500 and about 2000, or between 1000 and about 10,000, or between 1000 and about 8000, or between 1000 and about 6000, or between 1000 and about 4000, or between 1000 and about 2000, or between 2000 and about 10,000, or between 2000 and about 8000, or between 2000 and about 6000, or between 2000 and about 4000, or between 2000 and about 3000, or between 5000 and about 10,000, or between 5000 and about 8000, or between 5000 and about 6000, and the like.

In some embodiments, in any of the above formulas, the number of carbon atoms in any of R$_1$, R$_2$, R$_3$, R$^4$, R$^5$, R$_6$, R$_7$, R$_8$, R$_9$, R$_{10}$ and R$_{11}$ above, or R$_{12}$, R$_{13}$, R$_{14}$, R$_{15}$, R$_{16}$, R$_{17}$, R$_{18}$, R$_{19}$ and R$_{20}$ below, may independently be $C_1$-$C_{30}$, $C_1$-$C_{25}$, $C_1$-$C_{20}$, $C_1$-$C_{15}$, $C_1$-$C_{10}$, $C_1$-$C_5$, $C_2$-$C_{30}$, $C_2$-$C_{25}$, $C_2$-$C_{20}$, $C_2$-$C_{15}$, $C_2$-$C_{10}$, $C_2$-$C_5$, $C_3$-$C_{30}$, $C_3$-$C_{25}$, $C_3$-$C_{20}$, $C_3$-$C_{15}$, $C_3$-$C_{10}$, $C_4$-$C_{30}$, $C_4$-$C_{25}$, $C_4$-$C_{20}$, $C_4$-$C_{15}$, $C_4$-$C_{10}$, $C_5$-$C_{30}$, $C_5$-$C_{25}$, $C_5$-$C_{20}$, $C_5$-$C_{15}$, $C_5$-$C_{10}$, $C_{10}$-$C_{30}$, $C_{10}$-$C_{25}$, $C_{10}$-$C_{20}$, $C_{10}$-$C_{15}$, $C_{15}$-$C_{30}$, $C_{15}$-$C_{25}$, $C_{15}$-$C_{20}$, $C_{20}$-$C_{30}$, $C_{20}$-$C_{25}$, and so forth.

Preparation of Fluorene-Based Copolymers in Accordance with the Present Embodiments The fluorene-based copolymers are synthesized according to standard polymer chemistry using the appropriate monomeric units to produce the copolymers identified above. Polymerization techniques include, for example, transition metal catalyzed coupling or condensation (step reaction) polymerization, and the like.

In some embodiments, for forming copolymers in accordance with the present embodiments, condensation polymerization is employed. Condensation takes place between two or more polyfunctional molecules to produce a larger polyfunctional molecule and ultimately the copolymer. The reaction continues until one of the reagents is completely consumed. Equilibrium is established that can be shifted by controlling the amounts of the reactants and the products as well as the temperature, the ratio of the monomers, the type of solvents, the nature of different transition metal catalysts and so forth.

The conditions for the polymerization such as temperature, reaction medium, pH, duration, the order of addition of the reagents and the like are dependent on the type of polymerization employed, the nature of the monomer reagents including any functional group employed, the nature of any catalyst employed, and so forth. Such conditions are generally known since the types of polymerization techniques that can be used are known in the art.

The following is a list of functionalized monomers, by way of illustration and not limitation, for preparing copolymers in accordance with the present embodiments; the monomers are shown with functional groups, by way of illustration and not limitation, at the positions for monomer attachment to form a polymer chain:

XVI
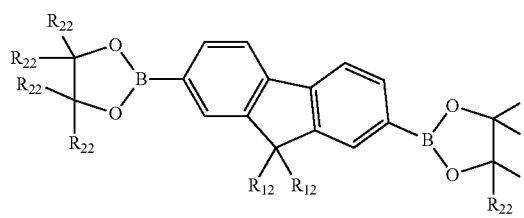

XVII
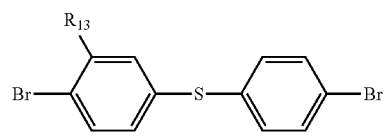

XVIII
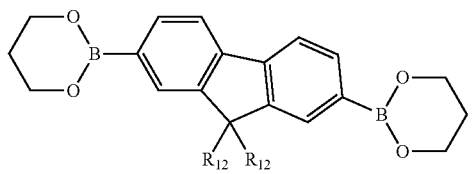

XIX
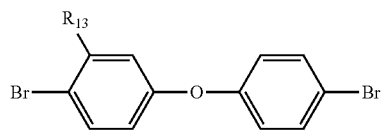

XX
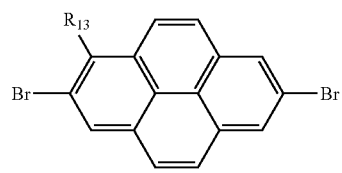

XXI
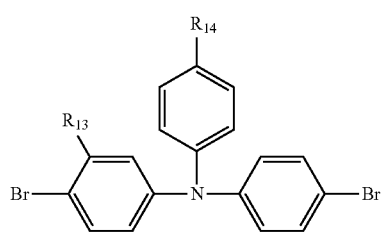

XXII
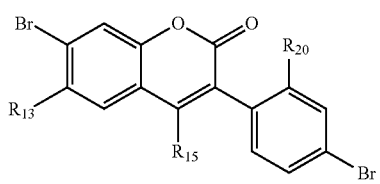

-continued

XXIII
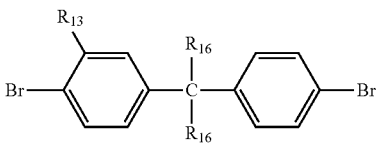

XXIV
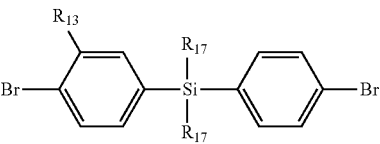

XXV
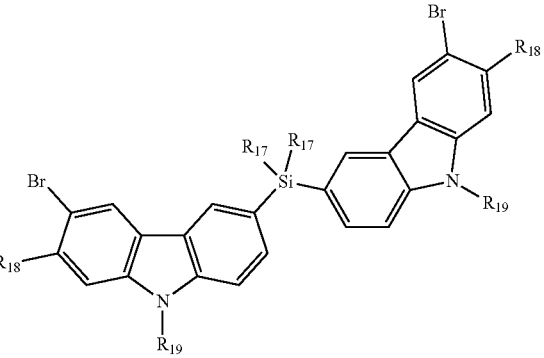

XXVI
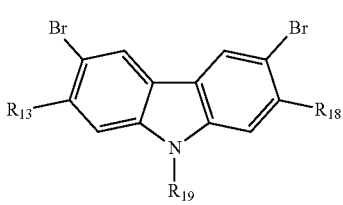

wherein:

$R_{12}$, $R_{13}$, $R_{15}$, and $R_{18}$ are each independently selected from the group consisting of $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, $R_{14}$, $R_{16}$, $R_{17}$, $R_{19}$ and $R_{20}$ are each independently selected from the group consisting of hydrogen, $C_1$-$C_{30}$ alkyl, $C_2$-$C_{30}$ alkenyl, $C_2$-$C_{30}$ alkynyl, $C_1$-$C_{30}$ aryl, $C_1$-$C_{30}$ alkoxy, $C_2$-$C_{30}$ alkenoxy, $C_2$-$C_{30}$ alkynoxy, $C_1$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_1$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_1$-$C_{30}$ aryl, and $R_{22}$ is independently selected from the group consisting of hydrogen, $C_1$-$C_{30}$ alkyl; in some embodiments $R_{22}$ is independently selected from the group consisting of lower alkyl.

In an example, by way of illustration and not limitation, a polymer of the type according to polymer IV, wherein X=O, may be formed from the following monomer units wherein $R_{22}$ in XVI are each methyl:

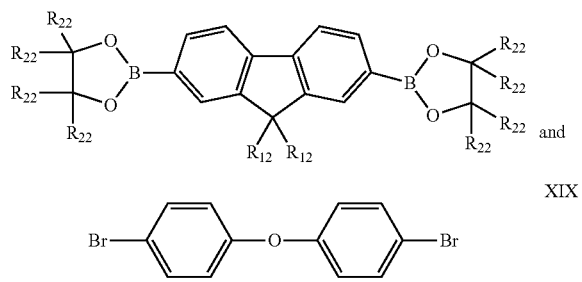

In another example, by way of illustration and not limitation, a polymer of the type according to polymer V, wherein Y=N, may be formed from the following monomer units wherein $R_{22}$ in XVI are each methyl:

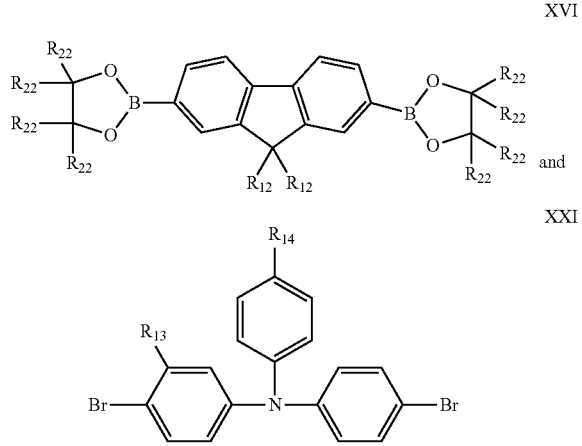

In another example, by way of illustration and not limitation, a polymer of the type according to polymer VI, wherein Z=C and $R_{16}$ are each phenyl, may be formed from the following monomer units wherein $R_{22}$ in XVI are each methyl:

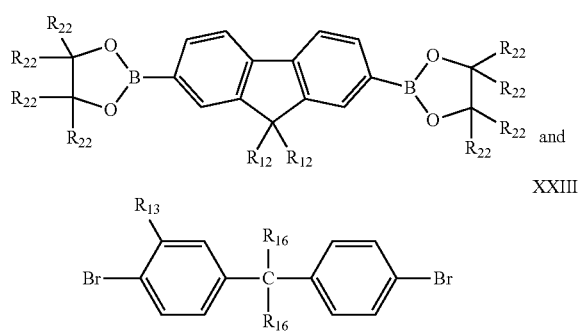

In another example, by way of illustration and not limitation, a polymer of the type according to polymer VII, with X=S, may be formed from the following monomer units wherein $R_{22}$ in XVI are each methyl:

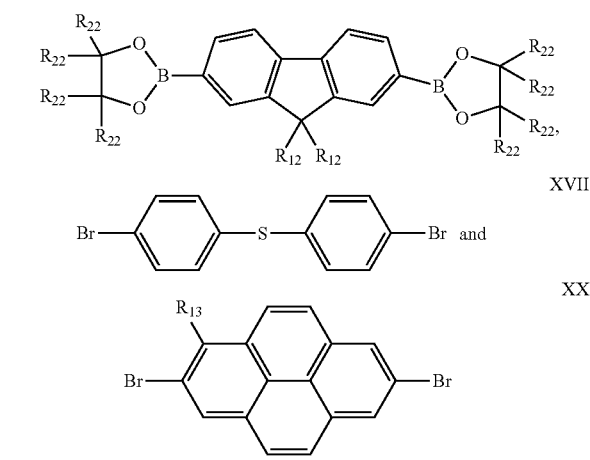

In another example, by way of illustration and not limitation, a polymer of the type according to polymer VIII, wherein Y=N, may be formed from the following monomer units wherein $R_{22}$ in XVI are each methyl:

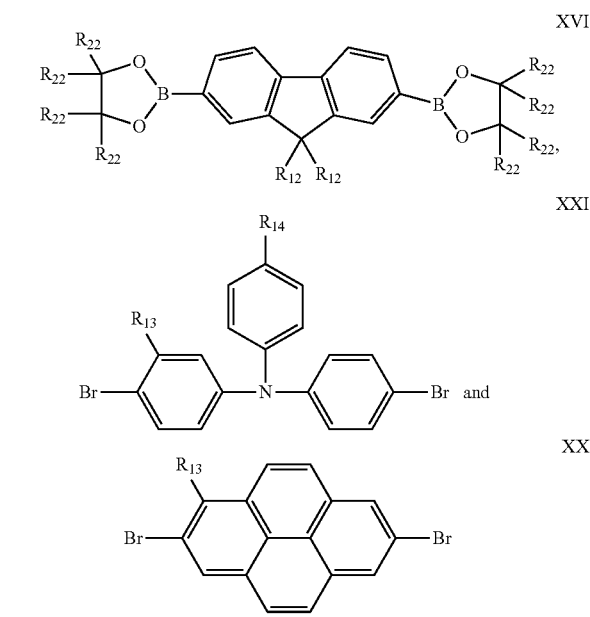

In another example, by way of illustration and not limitation, a polymer of the type according to polymer IX, wherein Z=Si and $R_{17}$ are each phenyl, may be formed from the following monomer units wherein $R_{22}$ in XVI are each methyl:

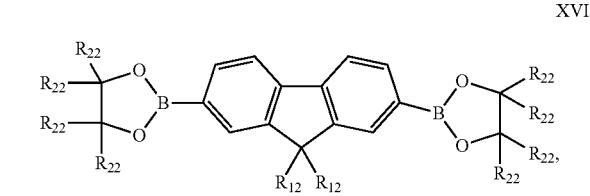

XXIV

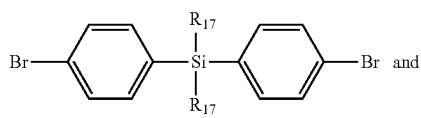

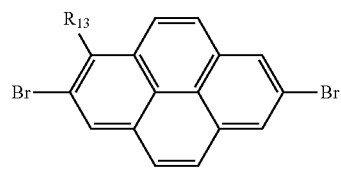

In another example, by way of illustration and not limitation, a polymer of the type according to polymer X, wherein X=O, may be formed from the following monomer units wherein $R_{22}$ in XVI are each methyl:

XVI

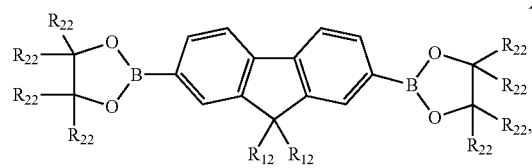

XIX

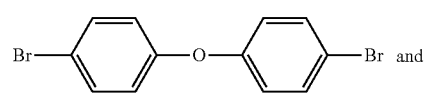

XXII

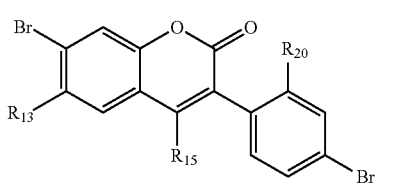

In another example, by way of illustration and not limitation, a polymer of the type according to polymer XI, wherein Y=N, may be formed from the following monomer units wherein $R_{22}$ in XVI are each methyl:

XVI

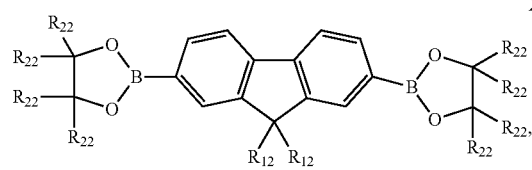

XXI

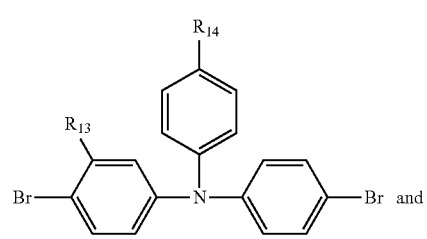

XXII

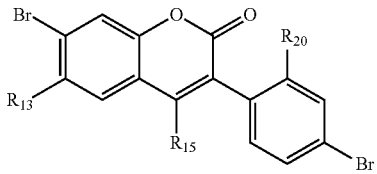

In another example, by way of illustration and not limitation, a polymer of the type according to polymer XII, wherein Z=Si and $R_{17}$ are each phenyl, may be formed from the following monomer units wherein $R_{22}$ in XVI are each methyl:

XVI

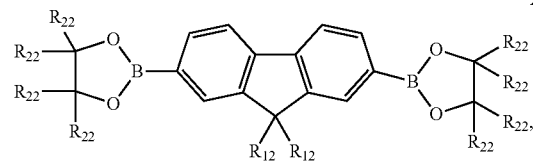

XXIV

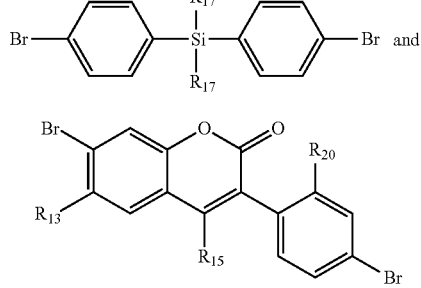

XXII

In another example, by way of illustration and not limitation, a polymer of the type according to polymer XIII, wherein X=S, may be formed from the following monomer units wherein $R_{22}$ in XVI are each methyl:

XVI

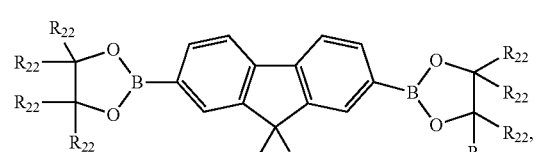

XVII

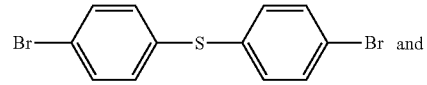

XXVI

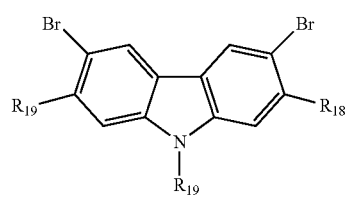

In another example, by way of illustration and not limitation, a polymer of the type according to polymer XIV, wherein Y=N, may be formed from the following monomer units wherein $R_{22}$ in XVI are each methyl:

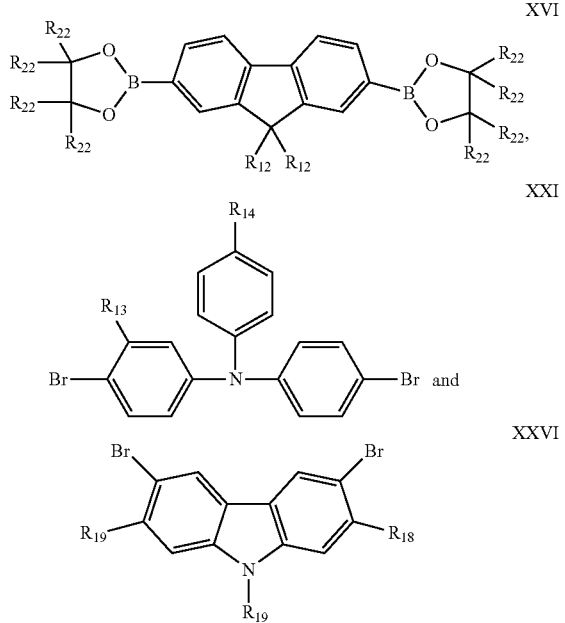

In another example, by way of illustration and not limitation, a polymer of the type according to polymer XV, wherein Z=Si and $R_{17}$ are each phenyl, may be formed from the following monomer units wherein $R_{22}$ in XVI are each methyl:

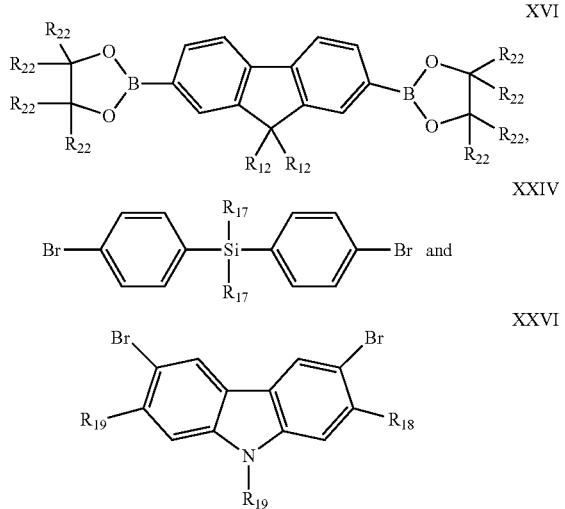

Specific Embodiments of the Use of the Fluorene-Based Copolymers

The present fluorene-based copolymers may be employed to provide local and uniform UV energy for emissive display applications based on energy transfer from the copolymer to quantum dots. The present materials have a large energy band gap and are stable UV emissive chemicals. The phrase "large energy band gap" means that the energy difference between the highest occupied molecular orbital (HOMO) and the lowest unoccupied molecular orbital (LUMO) of such copolymers is large enough so that they emit only UV or deep-blue light. Embodiments of the present fluorene-based copolymers find use as nanoscale UV energy sources in light-emitting devices and may be employed as, for example, emissive materials or layers in light-emitting diodes such as OLED's, PLED's and hybrid LED's, which may be used in display devices.

The structure of a basic organic light emitting diode comprises at least three layers, namely, two electrode layers and an organic light emission layer positioned between the two electrode layers. The two electrodes are connected to a power supply. In this embodiment, the electrode (cathode) that is in connection with a negative pole of the power supply functions as the electron injection layer (EIL), which injects electrons into the light emission layer when a voltage is applied. The electrode (anode) in connection with the positive pole of the power supply functions as the hole injection layer (HIL), which injects holes into the light emission layer when a voltage is applied. When the electrons and the holes meet in the organic light emitting layer (EML), they recombine across the energy gap (energy difference between the LUMO and HOMO levels of the EML polymer). The energy released from the recombination of electrons and holes is in the form of light and the color is determined by the value of the energy gap. In some embodiments, the device is a multi-layer device, which has an extra polymeric layer such as, for example, a polythiophene chemical, e.g., poly(3,4-ethylenedioxythiophene or PEDOT, and the like, Dupont buffer, and the like, which layer serves as an HIL as well.

In addition to the basic structure as described above, an electron transport layer (ETL) may be added between the EIL and the EML, and a hole transport layer (HTL) may be added between the HIL and the EML. In embodiments in which they are employed, the ETL and HTL provide better energy band alignment between the EIL, the HIL and the EML, respectively, which would improve transporting of electrons and holes from the EIL and the HIL, respectively, into the EML. Furthermore, in some embodiments, an electron blocking layer (EBL) may be added between the HIL and the EML. In some embodiments, a hole blocking layer (HBL) may be added between the EIL and the EML. The function of the EBL and the HBL is to block the escaped electrons and holes, respectively, that fail to recombine with each other. If both an EBL and an HBL are present, the escaped electrons and holes can be confined in the EML without leaking through and being collected by the respective electrodes that would contribute wasteful power consumption and reduced light emission efficiency. When the escaped electrons and holes are confined in the EML by the presence of an EBL and an HBL, there is further opportunity for the electrons and holes to recombine and generate light and thus, emission efficiency is enhanced. Similarly, the EBL and the HBL may be inserted between the HTL, the ETL and the EML, respectively, if an HTL and an ETL are used. Alternatively, through proper choice of materials and/or synthesis, the HTL and the ETL could also serve as an EBL and an HBL, respectively.

As used herein, the phrases "positioned between" and "disposed between" mean that the organic light emission layer lies directly between two electrode layers or lies indirectly between two electrode layers where one or more intervening layers as discussed above lie between the organic light emission layer and one or both of the electrode layers.

The fluorene-based copolymers in accordance with the present embodiments may be employed as the organic light emission layer positioned between the two electrode layers in the aforementioned devices. The present copolymers may be positioned or disposed between the two electrode layers by techniques known in the art. Such techniques include, by way of illustration and not limitation, (a) vapor deposition methods onto the inner face of one of the electrodes including, for example, vacuum vapor deposition, and the like; and (b) application methods, which include, for example, spin coating, slit coating, printing, inkjet deposition, dispensing, spraying and the like, onto the inner face of one of the electrodes, and the like. In addition, the present devices may be fabricated by sequentially laminating a first electrode, a film of the present fluorene-based copolymer and a second electrode onto a support. Other layers may be included in the lamination process as appropriate.

The thickness of the organic light emission layer is about 1 to about 500 nm, or about 1 to about 400 nm, or about 5 to about 500 nm, or about 5 to about 400 nm, or about 5 to about 300 nm, or about 5 to about 200 nm, or about 5 to about 100 nm, or about 10 to about 500 nm, or about 10 to about 400 nm, or about 10 to about 300 nm, or about 10 to about 200 nm, or about 10 to about 100 nm, or about 20 to about 500 nm, or about 20 to about 400 nm, or about 20 to about 300 nm, or about 20 to about 200 nm, or about 20 to about 100 nm, or about 30 to about 500 nm, or about 30 to about 400 nm, or about 30 to about 300 nm, or about 30 to about 200 nm, or about 30 to about 100 nm, or about 25 to about 250 nm, and so forth.

The thickness of the electrodes is independently about 0.1 to about 1000 nm, or about 0.1 to about 500 nm, or about 0.1 to about 400 nm, or about 0.1 to about 300 nm, or about 0.1 to about 200 nm, or about 0.1 to about 100 nm, or about 0.1 to about 50 nm, or about 1 to about 1000 nm, or about 1 to about 500 nm, or about 1 to about 400 nm, or about 1 to about 300 nm, or about 1 to about 200 nm, or about 1 to about 100 nm, or about 1 to about 50 nm, or about 5 to about 750 nm, or about 5 to about 500 nm, or about 5 to about 400 nm, or about 5 to about 300 nm, or about 5 to about 200 nm, or about 5 to about 100 nm, or about 5 to about 50 nm, or about 10 to about 500 nm, or about 10 to about 400 nm, or about 10 to about 300 nm, or about 10 to about 200 nm, or about 10 to about 100 nm, or about 10 to about 50 nm, or about 50 to about 500 nm, or about 50 to about 400 nm, or about 50 to about 300 nm, or about 50 to about 200 nm, or about 50 to about 100 nm, and so forth.

As discussed above, the light-emitting devices may additionally include one or more of a hole injecting layer, an electron injecting layer; a hole transporting layer, an electron transporting layer, an electron blocking layer, and/or a hole blocking layer, and the like, as are known in the art. The devices may also include a protective layer or a sealing layer for the purpose of reducing exposure of the device to atmospheric elements. Furthermore, the devices may be covered with, and/or packaged in, an appropriate material.

An example, by way of illustration and not limitation, of a device employing a fluorene-based copolymer in accordance with the present embodiments is depicted in FIG. 1. Referring to FIG. 1, light-emitting device 10 comprises first electrode 12 and second electrode 14. Disposed between 12 and 14 is layer 16 composed of a fluorene-based copolymer in accordance with the embodiments disclosed herein. Each of electrodes 12 and 14 is respectively connected to power supply 18 by means of lines 20 and 22. Power supply 18 is designed to separately activate electrode 12 and electrode 14.

Figure 2:
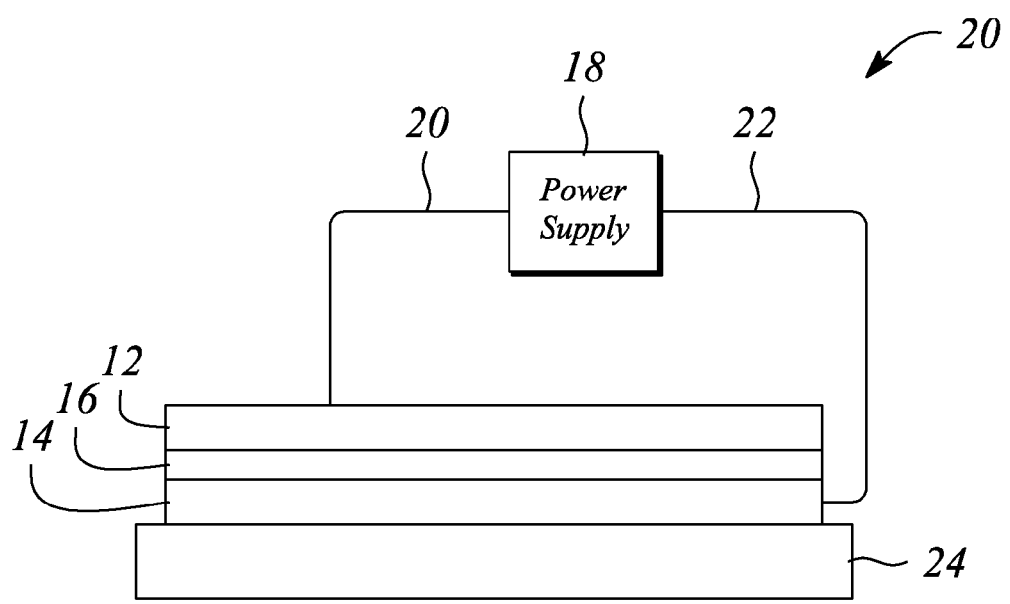
FIG. 2 is a schematic diagram of another embodiment of a light-emitting device employing a fluorene-based copolymer in accordance with the present invention.

Another example, by way of illustration and not limitation, of a device employing a fluorene-based copolymer in accordance with the present embodiments is depicted in FIG. 2. Referring to FIG. 2, light-emitting device 10 comprises first electrode 12 and second electrode 14. Disposed between 12 and 14 is layer 16 composed of a fluorene-based copolymer in accordance with the embodiments disclosed herein. Each of electrodes 12 and 14 is respectively connected to power supply 18 by means of lines 20 and 22. Power supply 18 is designed to separately activate electrode 12 and electrode 14. Electrode 14 is disposed on support 24.

Figure 3:
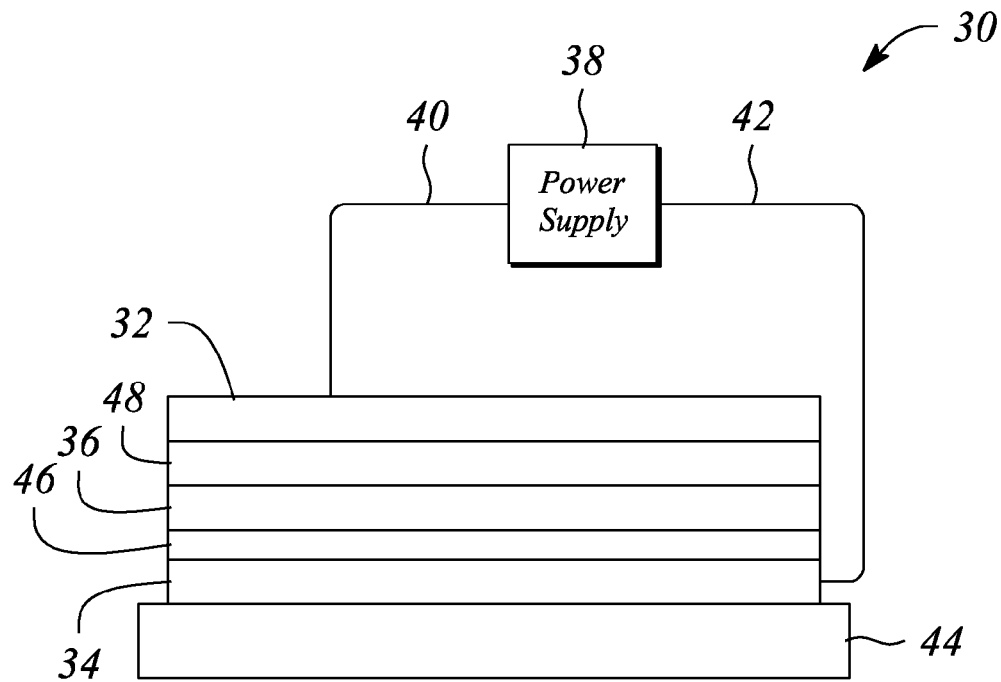
FIG. 3 is a schematic diagram of another embodiment of a light-emitting device employing a fluorene-based copolymer in accordance with the present invention.

Another example, by way of illustration and not limitation, of a device employing a fluorene-based copolymer in accordance with the present embodiments is depicted in FIG. 3. Referring to FIG. 3, light-emitting device 30 comprises first electrode 32 and second electrode 34, hole injecting layer 46, and electron injecting layer 48. Disposed between 46 and 48 is layer 36 composed of a fluorene-based copolymer in accordance with the embodiments disclosed herein. Each of electrodes 32 and 34 is respectively connected to power supply 38 by means of lines 40 and 42. Power supply 38 is designed to separately activate electrode 32 and electrode 34. Electrode 34 is disposed on support 44.

Figure 4:
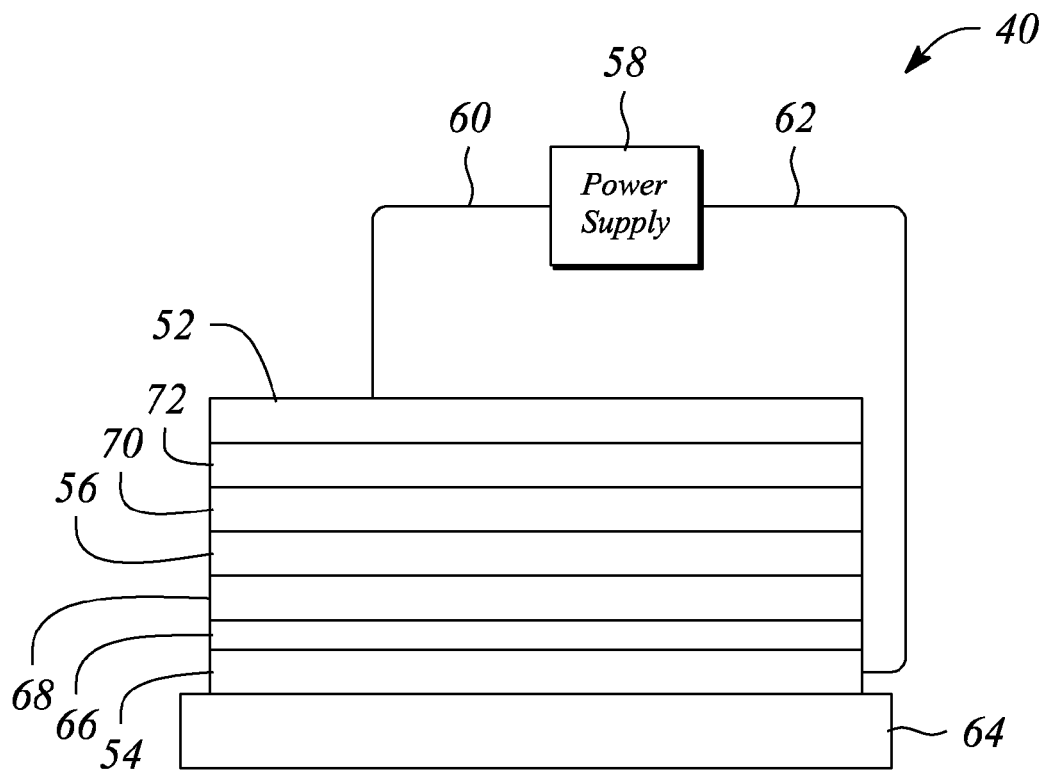
FIG. 4 is a schematic diagram of another embodiment of a light-emitting device employing a fluorene-based copolymer in accordance with the present invention.

Another example, by way of illustration and not limitation, of a device employing a fluorene-based copolymer in accordance with the present embodiments is depicted in FIG. 4. Referring to FIG. 4, light-emitting device 40 comprises first electrode 52 and second electrode 54, hole injecting layer 66, hole transporting layer 68, electron transporting layer 70 and electron injecting layer 72. Disposed between 68 and 70 is layer 56 composed of a fluorene-based copolymer in accordance with the embodiments disclosed herein. Each of electrodes 52 and 54 is respectively connected to power supply 58 by means of lines 60 and 62. Power supply 58 is designed to separately activate electrode 52 and electrode 54. Electrode 54 is disposed on support 64.

The anode may be formed from any material that has a relatively high work function, including metals such as, but not limited to, gold, platinum, silver, copper, nickel, palladium, cobalt, selenium, vanadium, tungsten, chromium and the like and combinations, alloys, oxides, sulfides and halides thereof, and including metal oxides such as, but not limited to, tin oxide, zinc oxide, indium oxide, indium tin oxide, and indium zinc oxide. The anode may also be formed from a conductive polymer such as, but not limited to, polyaniline, polypyrrole, polythiophene, polyphenylene sulfide, and the like. Each of the aforementioned materials may be used individually or in combination and the anode may be formed in a single layer construction or a multilayer construction.

The cathode may be formed from a material that has a relatively low work function (i.e., the highest occupied electron energy level is very close to the vacuum level) including metals such as, but not limited to, lithium, sodium, potassium, calcium, magnesium, aluminum, indium, ruthenium, titanium, manganese, yttrium, silver, lead, tin, chromium, and the like and alloys and oxides thereof. The cathode may be formed from an alloy of the aforementioned metals such as, for example, lithium-indium, sodium-potassium, magnesium-silver, aluminum-lithium, aluminum-magnesium, magnesium-indium and the like, or a metal oxide such as, for example, indium tin oxide. Each of the aforementioned materials may be used individually or in combination. The cathode may be formed in a single layer construction or a multilayer construction.

The support may be fabricated from any suitable material for providing stability to the device and a suitable platform for the layers of the device. Such materials include, for example, glass, metals, alloys, ceramics, semiconductor materials, plastics, and/or a combination of two or more of the above materials. The material for the support may be transparent, translucent or opaque depending on the manner in which the device is to be viewed and the like.

The hole injecting layer may be formed from any material that has a hole injecting property; such materials are well-known in the art and include, for example, polymer-based hole injecting materials.

Materials for forming an electron injecting layer are also known in the art. Such materials include, for example, organic compounds having electron injecting properties and inorganic compounds such as, for example, certain salts of alkali metals and alkaline earth metals such as, for example, fluorides, carbonates, oxides and the like. Specific examples, by way of illustration and not limitation, include LiF, $CsCO_3$, CaO and so forth.

The electron blocking layer may be formed from a material that has a LUMO level that is higher than that of the EML, and thus, forms a barrier to discourage electrons reaching the anode. This material may be a polymer-based chemical with high or low molecular weight. This material may also be a chemical compound comprising silicon, which may be, but not limited to, an inorganic insulator layer made of $SiO_2$, SiN, or the like, or an organic silicon-based polymer such as siloxane and the like.

The hole blocking layer may be formed from a material that has a HOMO level that is lower than that of the EML and thus, forms a barrier to discourage holes reaching the cathode. Such a material may be, for example, a polymer-based chemical with high or low molecular weight, small organic molecules and the like.

The thickness of each of the aforementioned additional layers, when employed in a device, may be independently about 0.1 to about 500 nm, or about 1 to about 500 nm, or about 1 to about 300 nm, or about 1 to about 250 nm, or about 5 to about 200 nm, or about 10 to about 150 nm, and so forth.

As mentioned above, the present devices may also comprise a protective layer or a sealing layer for the purpose of reducing exposure of the device to atmospheric elements such as, e.g., moisture, oxygen and the like. Examples of materials from which a protective layer may be fabricated include inorganic films such as, for example, diamond thin films, films comprising a metal oxide or a metal nitride; polymer films such as, for example, films comprising a fluorine resin, polyparaxylene, polyethylene, a silicone resin, a polystyrene resin or the like; and photocurable resins. In addition, the device itself may be covered with, for example, glass, a gas impermeable film, a metal or the like, and the device may be packaged with an appropriate sealing resin.

Additional applications of the present fluorene-based copolymers include energy donor material for an inorganic-organic hybrid LED device. An inorganic-organic hybrid LED offers longer emission life, better color purity and flexibility in precision color tuning than either OLED or PLED devices.

Discussion of Terms:

The following provides definitions for terms and phrases used above, which were not previously defined.

The phrase "at least" as used herein means that the number of specified items may be equal to or greater than the number recited. The phrase "about" as used herein means that the number recited may differ by plus or minus 10%; for example, "about 5" means a range of 4.5 to 5.5. The designations "first" and "second" are used solely for the purpose of differentiating between two items such as "first electrode" and "second electrode" and are not meant to imply any sequence or order or importance to one item over another.

The term "substituted" means that a hydrogen atom of a compound or moiety is replaced by another atom such as a carbon atom or a heteroatom. Substituents include, for example, alkyl, alkoxy, aryl, aryloxy, alkenyl, alkenoxy, alkynyl, alkynoxy, thio alkyl, thioalkenyl, thioalkynyl, thioaryl, and the like.

The term "heteroatom" as used herein means nitrogen, oxygen, phosphorus or sulfur. The terms "halo" and "halogen" mean a fluoro, chloro, bromo, or iodo substituent. The term "cyclic" means having an alicyclic or aromatic ring structure, which may or may not be substituted, and may or may not include one or more heteroatoms. Cyclic structures include monocyclic structures, bicyclic structures, and polycyclic structures. The term "alicyclic" is used to refer to an aliphatic cyclic moiety, as opposed to an aromatic cyclic moiety.

The phrase "aromatic ring system(s)" or "aromatic" as used herein includes monocyclic rings, bicyclic ring systems, and polycyclic ring systems, in which the monocyclic ring, or at least a portion of the bicyclic ring system or polycyclic ring system, is aromatic (exhibits, e.g., π-conjugation). The monocyclic rings, bicyclic ring systems, and polycyclic ring systems of the aromatic ring systems may include carbocyclic rings and/or heterocyclic rings. The term "carbocyclic ring" denotes a ring in which each ring atom is carbon. The term "heterocyclic ring" denotes a ring in which at least one ring atom is not carbon and comprises 1 to 4 heteroatoms.

The term "alkyl" as used herein means a branched, unbranched, or cyclic saturated hydrocarbon group, which typically, although not necessarily, contains from 1 to about 30 carbon atoms or more. Alkyls include, but are not limited to, methyl, ethyl, n-propyl, isopropyl, n-butyl, isobutyl, t-butyl, octyl, decyl, and the like, as well as cycloalkyl groups such as cyclopentyl, cyclohexyl and the like. The term "lower alkyl" means an alkyl group having from 1 to 6 carbon atoms. The term "higher alkyl" means an alkyl group having more than 6 carbon atoms, for example, 7 to 30 carbon atoms or more. As used herein, the term "substituted alkyl" means an alkyl substituted with one or more substituent groups. The term "heteroalkyl" means an alkyl in which at least one carbon atom is replaced with a heteroatom. If not otherwise indicated, the term "alkyl" includes unsubstituted alkyl, substituted alkyl, lower alkyl, and heteroalkyl.

As used herein, the term "alkenyl" means a linear, branched or cyclic hydrocarbon group of 2 to about 30 carbon atoms or more containing at least one double bond, such as ethenyl, n-propenyl, isopropenyl, n-butenyl, isobutenyl, octenyl, decenyl, tetradecenyl, hexadecenyl, eicosenyl, tetracosenyl, and the like. The term "lower alkenyl" means an alkenyl having from 2 to 6 carbon atoms. The term "higher alkenyl" means an alkenyl group having more than 6 carbon atoms, for example, 7 to 30 carbon atoms or more. The term "substituted alkenyl" means an alkenyl or cycloalkenyl substituted with one or more substituent groups. The term "heteroalkenyl" means an alkenyl or cycloalkenyl in which at least one carbon atom is replaced with a heteroatom. If not otherwise indicated, the term "alkenyl" includes unsubstituted alkenyl, substituted alkenyl, lower alkenyl, and heteroalkenyl.

As used herein, the term "alkynyl" means a linear, branched or cyclic hydrocarbon group of 2 to about 30 carbon atoms or more containing at least one triple bond, such as ethynyl, n-propynyl, isopropynyl, n-butynyl, isobutynyl, octynyl, decynyl, tetradecynyl, hexadecynyl, eicosynyl, tetracosynyl, and the like. The term "lower alkynyl" means an alkynyl having from 2 to 6 carbon atoms. The term "higher alkynyl" means an alkynyl group having more than 6 carbon atoms, for example, 7 to 30 carbon atoms or more. The term "substituted alkynyl" means an alkynyl or cycloalkynyl substituted with one or more substituent groups. The term "heteroalkynyl" means an alkynyl or cycloalkynyl in which at least one carbon atom is replaced with a heteroatom. If not otherwise indicated, the term "alkynyl" includes unsubstituted alkynyl, substituted alkynyl, lower alkynyl, and heteroalkynyl.

The term "alkylene" as used herein means a linear, branched or cyclic alkyl group in which two hydrogen atoms are substituted at locations in the alkyl group. Alkylene linkages thus include —$CH_2CH_2$— and —$CH_2CH_2CH_2$—, and so forth, as well as substituted versions thereof wherein one or more hydrogen atoms are replaced with a non-hydrogen substituent. The term "lower alkylene" refers to an alkylene group containing from 2 to 6 carbon atoms. The term "higher alkylene" means an alkylene group having more than 6 carbon atoms, for example, 7 to 30 carbon atoms or more. As used herein, the term "substituted alkylene" means an alkylene substituted with one or more substituent groups. As used herein, the term "heteroalkylene" means an alkylene wherein one or more of the methylene units are replaced with a heteroatom. If not otherwise indicated, the term "alkylene" includes heteroalkylene.

The term "alkenylene" as used herein means an alkylene containing at least one double bond, such as ethenylene (vinylene), n-propenylene, n-butenylene, n-hexenylene, and the like as well as substituted versions thereof wherein one or more hydrogen atoms are replaced with a non-hydrogen substituent. The term "lower alkenylene" refers to an alkenylene group containing from 2 to 6 carbon atoms. The term "higher alkenylene" means an alkenylene group having more than 6 carbon atoms, for example, 7 to 30 carbon atoms or more. As used herein, the term "substituted alkenylene" means an alkenylene substituted with one or more substituent groups. As used herein, the term "heteroalkenylene" means an alkenylene wherein one or more of the alkenylene units are replaced with a heteroatom. If not otherwise indicated, the term "alkenylene" includes heteroalkenylene.

The term "alkynylene" as used herein means an alkylene containing at least one triple bond, such as ethynylene, n-propynylene, n-butynylene, n-hexynylene, and the like. The term "lower alkynylene" refers to an alkynylene group containing from 2 to 6 carbon atoms. The term "higher alkynylene" means an alkynylene group having more than 6 carbon atoms, for example, 7 to 30 carbon atoms. As used herein, the term "substituted alkynylene" means an alkynylene substituted with one or more substituent groups. As used herein, the term "heteroalkynylene" means an alkynylene wherein one or more of the alkynylene units are replaced with a heteroatom. If not otherwise indicated, the term "alkynylene" includes heteroalkynylene.

The term "alkoxy" as used herein means an alkyl group bound to another chemical structure through a single, terminal ether linkage. As used herein, the term "lower alkoxy" means an alkoxy group, wherein the alkyl group contains from 1 to 6 carbon atoms, and includes, for example, methoxy, ethoxy, n-propoxy, isopropoxy, t-butyloxy, etc. The term "higher alkoxy" means an alkoxy group wherein the alkyl group has more than 6 carbon atoms, for example, 7 to 30 carbon atoms or more. As used herein, the term "substituted alkoxy" means an alkoxy substituted with one or more substituent groups. The term "heteroalkoxy" means an alkoxy in which at least one carbon atom is replaced with a heteroatom. If not otherwise indicated, the term "alkoxy" includes unsubstituted alkoxy, substituted alkoxy, lower alkoxy, and heteroalkoxy.

The term "alkenoxy" as used herein means an alkenyl group bound to another chemical structure through a single, terminal ether linkage. As used herein, the term "lower alkenoxy" means an alkenoxy group, wherein the alkenyl group contains from 2 to 6 carbon atoms, and includes, for example, ethenoxy, n-propenoxy, isopropenoxy, t-butenoxy, etc. The term "higher alkenoxy" means an alkenoxy group wherein the alkenyl group has more than 6 carbon atoms, for example, 7 to 30 carbon atoms or more. As used herein, the term "substituted alkenoxy" means an alkenoxy substituted with one or more substituent groups. The term "heteroalkenoxy" means an alkenoxy in which at least one carbon atom is replaced with a heteroatom. If not otherwise indicated, the term "alkenoxy" includes unsubstituted alkenoxy, substituted alkenoxy, lower alkenoxy, higher alkenoxy and heteroalkenoxy.

The term "alkynoxy" as used herein means an alkynyl group bound to another chemical structure through a single, terminal ether linkage. As used herein, the term "lower alkynoxy" means an alkynoxy group, wherein the alkynyl group contains from 2 to 6 carbon atoms, and includes, for example, ethynoxy, n-propynoxy, isopropynoxy, t-butynoxy, etc. The term "higher alkynoxy" means an alkynoxy group wherein the alkynyl group has more than 6 carbon atoms, for example, 7 to 30 carbon atoms or more. As used herein, the term "substituted alkynoxy" means an alkynoxy substituted with one or more substituent groups. The term "heteroalkynoxy" means an alkynoxy in which at least one carbon atom is replaced with a heteroatom. If not otherwise indicated, the term "alkynoxy" includes unsubstituted alkynoxy, substituted alkynoxy, lower alkynoxy, higher alkynoxy and heteroalkynoxy.

The term "thioalkyl" as used herein means an alkyl group bound to another chemical structure through a single, terminal thio (sulfur) linkage. As used herein, the term "lower thioalkyl" means a thioalkyl group, wherein the alkyl group contains from 1 to 6 carbon atoms, and includes, for example, thiomethyl, thioethyl, thiopropyl, etc. The term "higher thioalkyl" means a thioalkyl group wherein the alkyl group has more than 6 carbon atoms, for example, 7 to 30 carbon atoms or more. As used herein, the term "substituted thioalkyl" means a thioalkyl substituted with one or more substituent groups. The term "heterothioalkyl" means a thioalkyl in which at least one carbon atom is replaced with a heteroatom. If not otherwise indicated, the term "thioalkyl" includes unsubstituted thioalkyl, substituted thioalkyl, lower thioalkyl, and heterothioalkyl.

The term "thioalkenyl" as used herein means an alkenyl group bound to another chemical structure through a single, terminal thio (sulfur) linkage. As used herein, the term "lower thioalkenyl" means a thioalkenyl group, wherein the alkenyl group contains from 2 to 6 carbon atoms, and includes, for example, thioethenyl, thiopropenyl, etc. The term "higher thioalkenyl" means a thioalkenyl group wherein the alkenyl group has more than 6 carbon atoms, for example, 7 to 30 carbon atoms or more. As used herein, the term "substituted thioalkenyl" means a thioalkenyl substituted with one or more substituent groups. The term "heterothioalkenyl" means a thioalkenyl in which at least one carbon atom is replaced with a heteroatom. If not otherwise indicated, the term "thioalkenyl" includes unsubstituted thioalkenyl, substituted thioalkenyl, lower thioalkenyl, and heterothioalkenyl.

The term "thioalkynyl" as used herein means an alkynyl group bound to another chemical structure through a single, terminal thio (sulfur) linkage. As used herein, the term "lower thioalkynyl" means a thioalkynyl group, wherein the alkyl group contains from 2 to 6 carbon atoms, and includes, for example, thioethynyl, thiopropylynyl, etc. The term "higher thioalkynyl" means a thioalkynyl group wherein the alkynyl group has more than 6 carbon atoms, for example, 7 to 30 carbon atoms. As used herein, the term "substituted thioalkynyl" means a thioalkynyl substituted with one or more substituent groups. The term "heterothioalkynyl" means a thioalkynyl in which at least one carbon atom is replaced with a heteroatom. If not otherwise indicated, the term "thioalkynyl" includes unsubstituted thioalkynyl, substituted thioalkynyl, lower thioalkynyl, and heterothioalkynyl.

The term "aryl" means a group containing a single aromatic ring or multiple aromatic rings that are fused together, directly linked, or indirectly linked (such that the different aromatic rings are bound to a common group such as a methylene or ethylene moiety). Aryl groups described herein may contain, but are not limited to, from 5 to 30 carbon atoms. Aryl groups include, for example, phenyl, naphthyl, anthryl, phenanthryl, biphenyl, diphenylether, diphenylamine, benzophenone, and the like. The term "substituted aryl" refers to an aryl group comprising one or more substituent groups. The term "heteroaryl" means an aryl group in which at least one carbon atom is replaced with a heteroatom. If not otherwise indicated, the term "aryl" includes unsubstituted aryl, substituted aryl, and heteroaryl.

The term "aryloxy" as used herein means an aryl group bound to another chemical structure through a single, terminal ether (oxygen) linkage. The term "phenoxy" as used herein is aryloxy wherein aryl is phenyl.

The term "thioaryl" as used herein means an aryl group bound to another chemical structure through a single, terminal thio (sulfur) linkage. The term "thiophenyl" as used herein is thioaryl wherein aryl is phenyl.

EXAMPLES

Preparation of XVI wherein $R_{12}$ are each n-hexyl and $R_{22}$ are each methyl A mixture of 2,7-dibromo-9,9-dihexyl-9H-fluorene (15 g, 30.5 mmol), KOAc (potassium acetate) (18 g, 183 mmol), bis(pinacolato)diborane (16.4 g, 64 mmol), Pd(dppf)Cl$_2$ (1.8 g, 0.22 mmol) in 150 mL of 1,4-dioxane is stirred for 12 h at 80° C. After the mixture cooled to room temperature, water and chloroform are added into the mixture, and the separated organic layer is washed with brine and water and is dried over anhydrous Na$_2$SO$_4$. The solvent is removed under vacuum and the residue is purified over silica gel column chromatography with petroleum as the eluent to give 2-(9,9-dihexyl-2-(4,4,5,5-tetramethyl-1,3,2-dioxaborolan-2-yl)-9H-fluoren-7-yl)-4,4,5,5-tetramethyl-1,3,2-dioxaborolane (XVI wherein $R_{12}$ are each n-hexyl and $R_{22}$ are each methyl).

Preparation of polymer VIII wherein Y=N and $R_1$ are each n-hexyl, $R_2$ is n-pentyl, $R_3$ is hydrogen and $R_6$ is n-pentyl A mixture of XVI, wherein $R_{12}$ are each n-hexyl and $R_{22}$ are each methyl, from above (2 mmol wherein mmol=millimoles), (4-bromophenyl)-(4-bromophenyl-n-pentylphenyl)-phenylamine (XXI wherein $R_{13}$ is n-pentyl and $R_{24}$ is hydrogen) (1.0 mmol), and 3-n-pentyl-2,7-dibromopyrene (XX wherein $R_{13}$ is n-pentyl) (1.0 mmol) and palladium catalyst in tetrahydrofuran (THF) is refluxed for 24 hours. Then, the reaction mixture is quenched with water and extracted with chloroform. Evaporation of solvent, followed by flash chromatography gives the desired UV polymer of a type according to polymer VIII, wherein Y=N, a type according to polymer VIII, wherein Y=N and $R_1$ are each n-hexyl, $R_2$ is n-pentyl, $R_3$ is hydrogen and $R_6$ is n-pentyl.

Preparation of polymer IV wherein X=O and R1 are each n-hexyl and R2 is phenyl

A mixture of XVI, wherein $R_{12}$ are each n-hexyl and $R_{22}$ are each methyl, from above (1.0 mmol) and (4-bromophenyl) (3-phenyl-4-bromophenyl)ether (XIX wherein $R_{13}$ is phenyl) (1.0 mmol), and palladium catalyst in toluene is refluxed for 24 hours. Then, the reaction mixture is quenched with water and extracted with chloroform. Evaporation of solvent, followed by flash chromatography gives the desired UV polymer of a type according to polymer IV wherein X=O and $R_1$ are each n-hexyl and $R_2$ is phenyl.

Preparation of polymer X wherein X=S and $R_1$ are each n-hexyl, $R_7$ is methyl, $R_8$ is methyl, $R_9$ is methyl and $R_2$ is methyl A mixture of XVI, wherein $R_{12}$ are each n-hexyl and $R_{22}$ are each methyl, from above (2 mmol), XXII (wherein $R_{13}$, $R_{15}$ and $R_{20}$ are each methyl) (1.0 mmol), and (4-bromophenyl) (3-methyl-4-bromophenyl)ether (XVII wherein $R_{13}$ is methyl) (1.0 mmol) and palladium catalyst in THF is refluxed for 24 hours. Then, the reaction mixture is quenched with water and extracted with chloroform. Evaporation of solvent, followed by flash chromatography gives the desired UV polymer of a type according to polymer X wherein X=S and $R_1$ are each n-hexyl, $R_7$ is methyl, $R_8$ is methyl, $R_9$ is methyl and $R_2$ is methyl.

Preparation of polymer XV wherein Z=Si, $R_1$ are each n-hexyl, $R_{10}$ is $C_{20}H_{40}CH_3$, $R_{11}$ is methyl, $R_2$ is methyl, $R_3$ is n-hexyl, $R_3$ is methyl A mixture of XVI, wherein $R_{12}$ are each n-hexyl and $R_{22}$ are each methyl, from above (2 mmol), XXVI (wherein $R_{13}$ is $C_{20}H_4OCH_3$, $R_{19}$ is methyl, $R_{18}$ is hydrogen) (1.0 mmol), and XXIV (wherein $R_{13}$ is n-hexyl and $R_{17}$ is 4-methylphenyl) (1.0 mmol) and palladium catalyst in THF is refluxed for 24 hours. Then, the reaction mixture is quenched with water and extracted with chloroform. Evaporation of solvent, followed by flash chromatography gives the desired UV polymer of a type according to polymer XV wherein Z=Si, $R_1$ are each n-hexyl, $R_{10}$ is $C_{20}H_{40}CH_3$, $R_{11}$ is methyl, $R_2$ is methyl, $R_3$ is n-hexyl, $R_3$ is methyl.

The aforementioned fluorene-based polymers are each incorporated into a device comprising two electrode layers and an organic light emission layer positioned between the two electrode layers. Each of the fluorene-based polymers is employed as the organic light emission layer. Each of the devices exhibited UV or deep-blue emission upon activation of the electrodes by a voltage source.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims. Furthermore, the foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description; they are not intended to be exhaustive or to limit the invention to the precise forms disclosed. Many modifications and variations are possible in view of the above teachings. The embodiments were chosen and described in order to explain the principles of the invention and its practical applications and to thereby enable others skilled in the art to utilize the invention.

What is claimed is:

1. A fluorene-based copolymer of the formula:

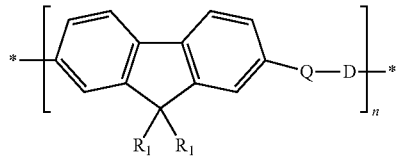

wherein:
- $R_1$ are each independently a steric hindering group,
- Q is one or more fused aromatic rings,
- D is a group comprising an atom that is one of divalent, trivalent and tetravalent, wherein one valency of the atom is filled by an aromatic moiety attached to Q, and wherein the aromatic moiety has a steric hindering group attached thereto, and wherein remaining valencies of the atom are filled with aromatic substituents, and
- n is an integer selected between 2 and 10,000,
- wherein the steric hindering groups of $R_1$ and D provide sufficient steric interaction such that the spatial conformation of formula I is non-planar, and
- wherein the copolymer exhibits UV light emission.

2. The fluorene-based copolymer of claim 1, wherein $R_1$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl.

3. A fluorene-based copolymer of claim 1, wherein Q is one or more fused aromatic rings, which comprise at least one steric hindering group.

4. The fluorene-based copolymer of claim 1, wherein D is selected from the group consisting of

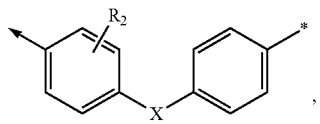

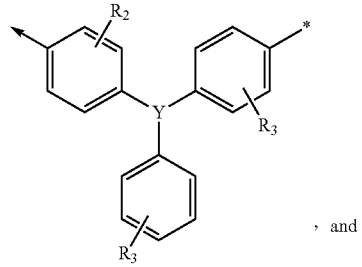

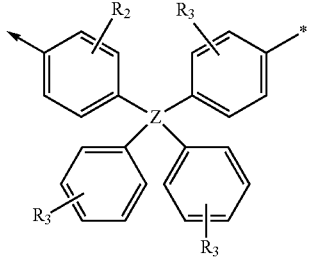

wherein the arrow indicates a point of attachment to Q, and wherein
- X is O, S, Te, or Se,
- Y is N or P,
- Z is C or $S_1$,
- $R_2$ is selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and
- $R_3$ are each independently selected from the group consisting of hydrogen, $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl.

5. The fluorene-based copolymer of claim 1 having the formula:

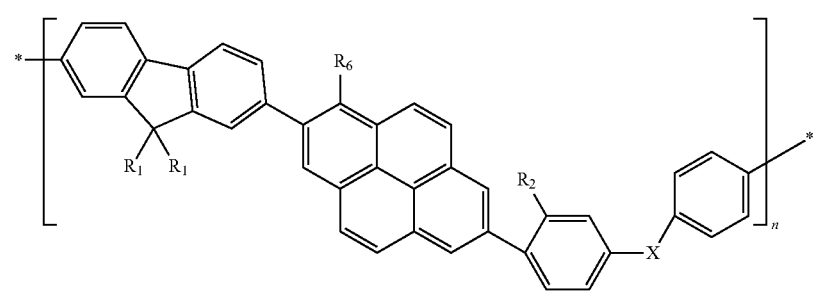

wherein
X is O, S, Te, or Se,
R$_1$, R$_2$ and R$_6$ are each independently selected from the group consisting of C$_1$-C$_{30}$ alkyl, C$_2$-C$_{30}$ alkenyl, C$_2$-C$_{30}$ alkynyl, C$_5$-C$_{30}$ aryl, C$_1$-C$_{30}$ alkoxy, C$_2$-C$_{30}$ alkenoxy, C$_2$-C$_{30}$ alkynoxy, C$_5$-C$_{30}$ aryloxy, C$_1$-C$_{30}$ thioalkyl, C$_2$-C$_{30}$ thioalkenyl, C$_2$-C$_{30}$ thioalkynyl, C$_5$-C$_{30}$ thioaryl, C(O)OR$^4$, N(R$^4$)(R$^5$), C(O)N(R$^4$)(R$^5$), F, Cl, Br, NO$_2$, CN, acyl, carboxylate and hydroxy, wherein R$^4$ and R$^5$ are each independently selected from the group consisting of hydrogen, C$_1$-C$_{30}$ alkyl and C$_5$-C$_{30}$ aryl, and
n is an integer selected between 2 and 10,000;
or having the formula:

Br, NO$_2$, CN, acyl, carboxylate and hydroxy, wherein R$^4$ and R$^5$ are each independently selected from the group consisting of hydrogen, C$_1$-C$_{30}$ alkyl and C$_5$-C$_{30}$ aryl,
R$_3$ is selected from the group consisting of hydrogen, C$_1$-C$_{30}$ alkyl, C$_2$-C$_{30}$ alkenyl, C$_2$-C$_{30}$ alkynyl, C$_5$-C$_{30}$ aryl, C$_1$-C$_{30}$ alkoxy, C$_2$-C$_{30}$ alkenoxy, C$_2$-C$_{30}$ alkynoxy, C$_5$-C$_{30}$ aryloxy, C$_1$-C$_{30}$ thioalkyl, C$_2$-C$_{30}$ thioalkenyl, C$_2$-C$_{30}$ thioalkynyl, C$_5$-C$_{30}$ thioaryl, C(O)OR$^4$, N(R$^4$)(R$^5$), C(O)N(R$^4$)(R$^5$), F, Cl, Br, NO$_2$, CN, acyl, carboxylate and hydroxy, wherein R$^4$ and R$^5$ are each independently selected from the group consisting of hydrogen, C$_1$-C$_{30}$ alkyl and C$_5$-C$_{30}$ aryl, and
n is an integer selected between 2 and 10,000;
or having the formula:

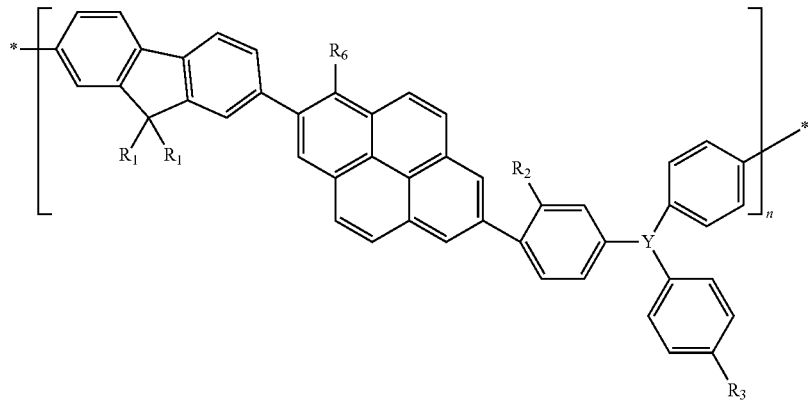

VIII wherein
Y is N or P,
R$_1$, R$_2$ and R$_6$ are each independently selected from the group consisting of C$_1$-C$_{30}$ alkyl, C$_2$-C$_{30}$ alkenyl, C$_2$-C$_{30}$ alkynyl, C$_5$-C$_{30}$ aryl, C$_1$-C$_{30}$ alkoxy, C$_2$-C$_{30}$ alkenoxy, C$_2$-C$_{30}$ alkynoxy, C$_5$-C$_{30}$ aryloxy, C$_1$-C$_{30}$ thioalkyl, C$_2$-C$_{30}$ thioalkenyl, C$_2$-C$_{30}$ thioalkynyl, C$_5$-C$_{30}$ thioaryl, C(O)OR$^4$, N(R$^4$)(R$^5$), C(O)N(R$^4$)(R$^5$), F, Cl,

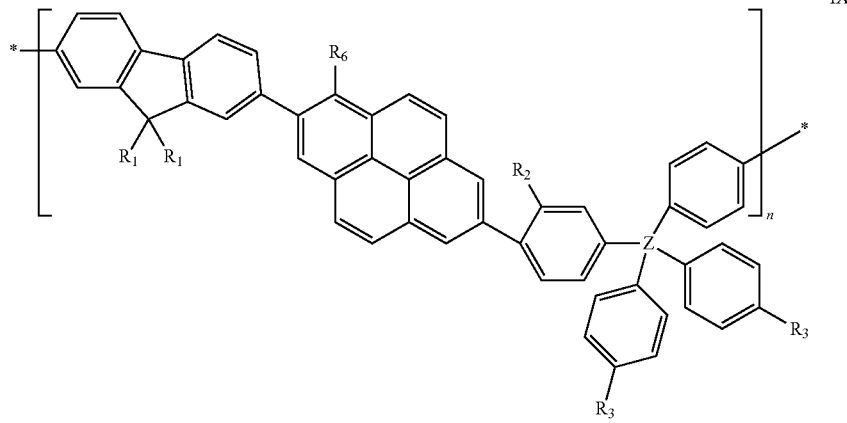

IX wherein

Z is C or $S_1$, $R_1$, $R_2$ and $R_6$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000;

or having the formula:

wherein

X is O, S, Te, or Se, $R_1$, $R_2$, $R_7$, $R_8$ and $R_9$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000;

or having the formula:

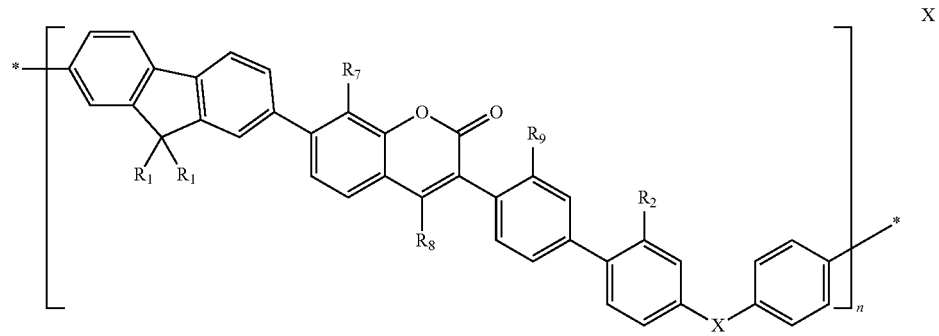

X

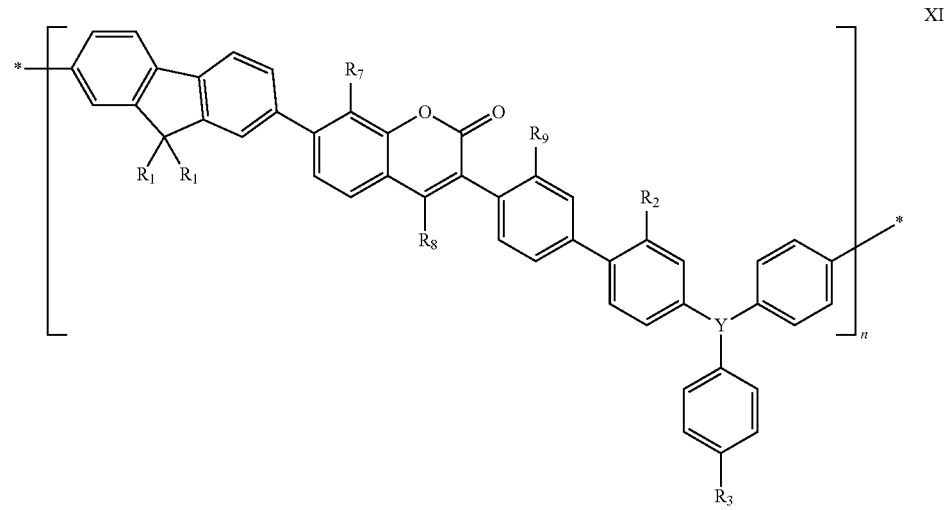

XI wherein
Y is N or P, $R_1$, $R_2$, $R_7$, $R_8$ and $R_9$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000;

or having the formula:

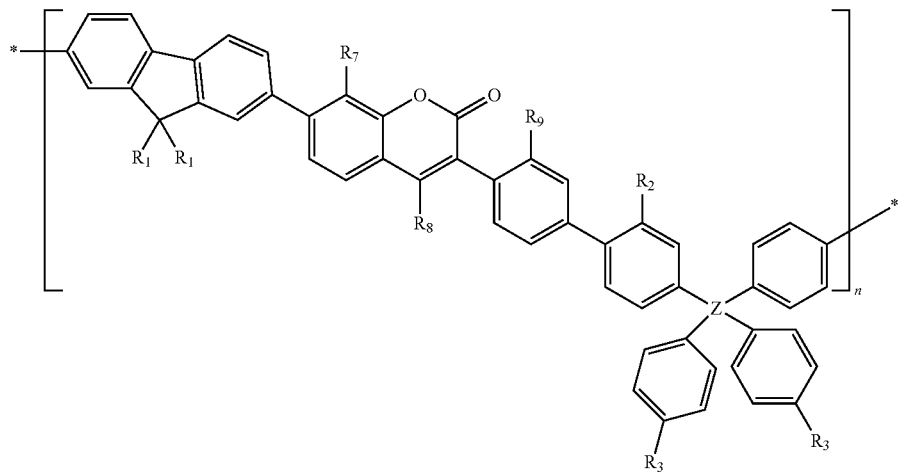

wherein

Z is C or $S_1$, $R_1$, $R_2$, $R_7$, $R_8$ and $R_9$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000;

or having the formula:

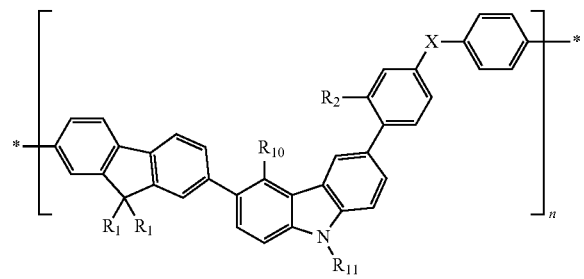

wherein

X is O, S, Te, or Se, $R_1$, $R_2$, $R_{10}$ and $R_{11}$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000;

or having the formula:

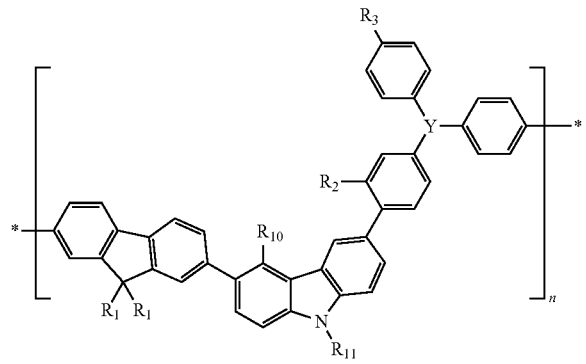

wherein

Y is N or P, $R_1$, $R_2$, $R_{10}$, and $R_{11}$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy (such as, e.g., phenoxy), $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000;

or having the formula:

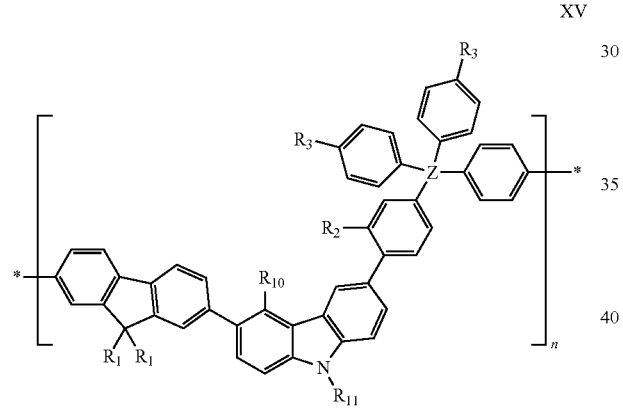

XV wherein

Z is C or $S_1$, $R_1$, $R_2$, $R_{10}$ and $R_{11}$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, $R_3$ is selected from the group consisting of hydrogen, $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)$ $(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000.

6. A light-emitting device comprising the fluorene-based copolymer of claim 1.

7. The device of claim 6 wherein the fluorene-based copolymer is in the form of a layer disposed between two electrodes.

8. A light emitting device comprising:

(a) a first electrode;

(b) a second electrode; and (c) a polymeric layer disposed between the first electrode and the second electrode, wherein the polymeric layer comprises a fluorene-based copolymer of the formula:

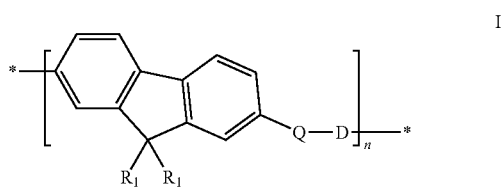

I wherein $R_1$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, Q is one or more fused aromatic rings, D is a group comprising an atom that is one of divalent, trivalent and tetravalent, wherein one valency of the atom is filled by an aromatic group attached to Q, and wherein the aromatic group has a steric hindering group attached thereto, and wherein remaining valencies of the atom are filled with aromatic substituents, and n is an integer selected between 2 and 10,000.

9. The device of claim 8, wherein the aromatic group and the aromatic substituents are phenyl.

10. The device of claim 8, wherein D is a group comprising an atom that is one of divalent, trivalent and tetravalent, wherein one valency of the atom is filled by an aromatic moiety attached to Q at a position that is para to a point of attachment of the atom, and wherein the aromatic moiety has a steric hindering group at a position that is ortho to a point of attachment of the aromatic moiety to Q, and wherein remaining valencies of the atom are filled with aromatic substituents.

11. The device of claim 8, wherein D is selected from the group consisting of

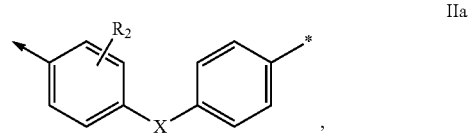

IIa

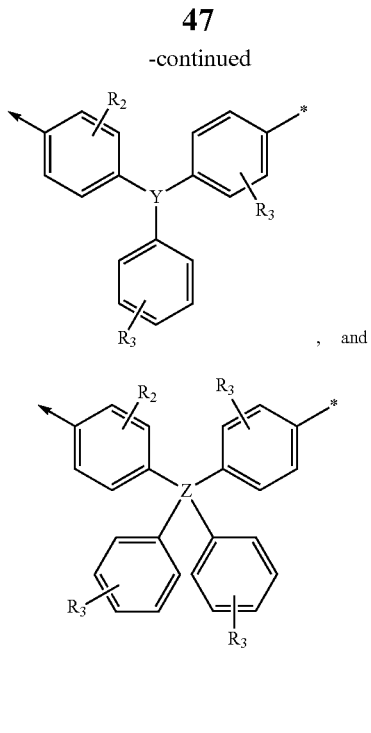

, and

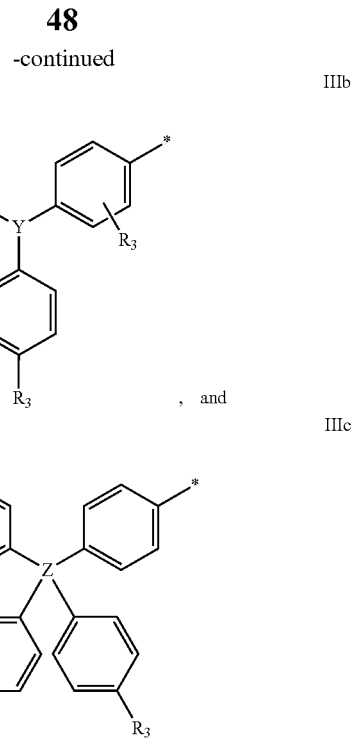

, and wherein the arrow indicates a point of attachment to Q, and wherein

X is O, S, Te, or Se,

Y is N or P,

Z is C or Si, $R_2$ is selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, C(O)O$R^4$, N($R^4$)($R^5$), C(O)N($R^4$)($R^5$), F, Cl, Br, NO$_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, $R_3$ are each independently selected from the group consisting of hydrogen, $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, C(O)O$R^4$, N($R^4$)($R^5$), C(O)N($R^4$)($R^5$), F, Cl, Br, NO$_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000.

12. The device of claim 8, wherein D is selected from the group consisting of

IIIa wherein the arrows indicate a point of attachment to in the fluorene-based copolymer, and wherein X is O, S, Te, or Se, Y is N or P, Z is C or Si, $R_2$ is selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, C(O)O$R^4$, N($R^4$)($R^5$), C(O)N($R^4$)($R^5$), F, Cl, Br, NO$_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, $R_3$ are each independently selected from the group consisting of hydrogen, $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, C(O)O$R^4$, N($R^4$)($R^5$), C(O)N($R^4$)($R^5$), F, Cl, Br, NO$_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000.

13. A method for forming a fluorene-based copolymer that exhibits enhanced emission properties and stability compared to a fluorene-based polymer that has a planar spatial conformation, the method comprising forming the fluorene-based copolymer from a monomeric unit that comprises a fluorene group and at least one chemical group having a sterically hindered structure, wherein the chemical group renders the spatial conformation of the fluorene-based copolymer nonplanar and wherein the chemical group comprises a one or more fused aromatic rings, and (b) a moiety selected from the group consisting of

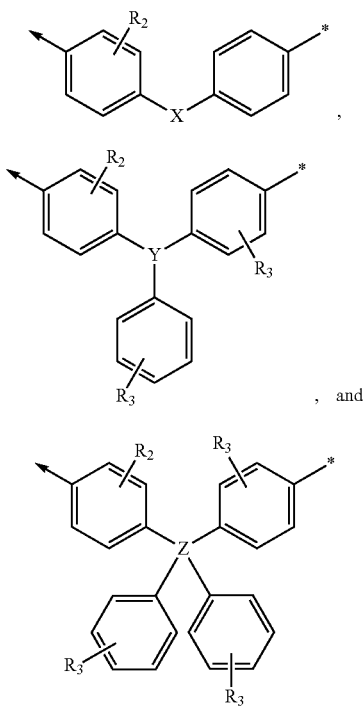

wherein the arrows indicate a point of attachment in the fluorene-based copolymer, and wherein X is O, S, Te, or Se, Y is N or P, Z is C or Si, $R_2$ is selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of $C_1$-$C_{30}$ alkyl and $C_5$-$C_{30}$ aryl, $R_3$ are each independently selected from the group consisting of $C_1$-$C_{30}$ alkyl, $C_2$-$C_{30}$ alkenyl, $C_2$-$C_{30}$ alkynyl, $C_5$-$C_{30}$ aryl, $C_1$-$C_{30}$ alkoxy, $C_2$-$C_{30}$ alkenoxy, $C_2$-$C_{30}$ alkynoxy, $C_5$-$C_{30}$ aryloxy, $C_1$-$C_{30}$ thioalkyl, $C_2$-$C_{30}$ thioalkenyl, $C_2$-$C_{30}$ thioalkynyl, $C_5$-$C_{30}$ thioaryl, $C(O)OR^4$, $N(R^4)(R^5)$, $C(O)N(R^4)(R^5)$, F, Cl, Br, $NO_2$, CN, acyl, carboxylate and hydroxy, wherein $R^4$ and $R^5$ are each independently selected from the group consisting of hydrogen, $C_1$-$C_{30}$ alkyl and $C_5$-$C_{30}$ aryl, and n is an integer selected between 2 and 10,000.

* * * * *

UNITED STATES PATENT AND TRADEMARK OFFICE
CERTIFICATE OF CORRECTION

PATENT NO. : 8,785,004 B2
APPLICATION NO. : 13/146398
DATED : July 22, 2014
INVENTOR(S) : Zhang-Lin Zhou et al.

It is certified that error appears in the above-identified patent and that said Letters Patent is hereby corrected as shown below:

In the Claims

Column 38, line 30, in Claim 4, delete "$S_1$," and insert -- Si, --, therefor.

Column 41, line 2, in Claim 5, delete "$S_1$," and insert -- Si, --, therefor.

Column 43, line 46, in Claim 5, delete "$S_1$," and insert -- Si, --, therefor.

Column 45, line 17, in Claim 5, delete "aryloxy (such as, e.g., phenoxy)," and insert -- aryloxy, --, therefor.

Column 45, line 47, in Claim 5, delete "$S_1$," and insert -- Si, --, therefor.

Column 48, line 29, in Claim 12, delete "to" and insert -- to Q --, therefor.

Column 48, line 65, in Claim 13, delete "a" and insert -- (a) --, therefor.

Column 50, line 17, in Claim 13, after "consisting of" insert -- hydrogen, --.

Column 50, line 19, in Claim 13, after "consisting of" insert -- hydrogen, --.

Signed and Sealed this
Tenth Day of February, 2015

Michelle K. Lee
*Deputy Director of the United States Patent and Trademark Office*